(12) United States Patent
Shin et al.

(10) Patent No.: US 12,065,455 B2
(45) Date of Patent: Aug. 20, 2024

(54) ORGANIC COMPOUND, ORGANIC LIGHT EMITTING DIODE AND ORGANIC LIGHT EMITTING DEVICE INCLUDING THE COMPOUND

(71) Applicant: LG DISPLAY CO., LTD., Seoul (KR)

(72) Inventors: In-Ae Shin, Paju-si (KR); Kyung-Jin Yoon, Paju-si (KR); Dae-Wi Yoon, Paju-si (KR); Suk-Young Bae, Paju-si (KR); Mi-Sang Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 798 days.

(21) Appl. No.: 17/103,097

(22) Filed: Nov. 24, 2020

(65) Prior Publication Data

US 2021/0163504 A1 Jun. 3, 2021

(30) Foreign Application Priority Data

Nov. 28, 2019 (KR) .................. 10-2019-0155567

(51) Int. Cl.
| | | |
|---|---|---|
| *C07F 5/02* | (2006.01) | |
| *H10K 50/11* | (2023.01) | |
| *H10K 85/30* | (2023.01) | |
| *H10K 85/60* | (2023.01) | |
| *H10K 101/10* | (2023.01) | |

(52) U.S. Cl.
CPC ............ *C07F 5/02* (2013.01); *H10K 50/11* (2023.02); *H10K 85/322* (2023.02); *H10K 85/631* (2023.02); *H10K 85/657* (2023.02); *H10K 85/658* (2023.02); *H10K 2101/10* (2023.02)

(58) Field of Classification Search
None
See application file for complete search history.

(56) References Cited

FOREIGN PATENT DOCUMENTS

CN 109423279 A 3/2019

OTHER PUBLICATIONS

Zervaki E. Galateia et al. "Scorpion"-shaped mono(carboxy)porphyrin-(BODIPY)2, a novel triazine bridged triad: synthesis, characterization and dye sensitized solar cell (DSSC) applications, J. Mater. Chem. C, 2015, vol. 3, p. 5652-5664 (Year: 2015).*

Rajneesh Misra et al. "meso-Aryloxy and meso-arylaza linked BODIPY dimers: synthesis, structures and properties" New J. Chem. 2014, vol. 38, p. 3579-3585 (Year: 2014).*
Extended European Search Report dated Apr. 29, 2021, issued in corresponding European Patent Application No. 20206635.3.
B. Kucukoz et al., "Enhancement of two photon absorption properties and intersystem crossing by charge transfer in pentaaryl boron-dipyrromethene (BODIPY) derivatives," Phys Chem Chem Phys, 18:19, 13546-13553 (2016).
Summers Gareth H. et al., "Design and characterisation of bodipy sensitizers for dye-sensitized NiO solar cells" Phys Chem Chem Phys, 18:2 1059.
Lui Haizhen et al., "Theoretical Design of D-1'I-A-A Sensitizers with Narrow Band Gap and Broad Spectral Response Based on Boron Dipyrromethene for Dye-Sensitized Solar Cells" J Chem Inf Model, 59:5 2248-2256 2019.
Sharma et al., "A mono(carboxy)porphyrin-triazine-(bodipy)2 triad as a donor for bulk heterojunction organic solar cells," 2015, Journal of Materials Chemistry C, vol. 3, p. 6209-6217.
Treich et al., "Synthesis and characterization of chiral and achiral diamines containing one or two BODIPY molecules," New J. Chem., 2017, vol. 41, p. 14370-14378.
Office Action issued Jan. 12, 2024 for Chinese Patent Application No. 202011265379.0.

* cited by examiner

Primary Examiner — Dylan C Kershner
Assistant Examiner — Seokmin Jeon
(74) Attorney, Agent, or Firm — Morgan, Lewis & Bockius LLP

(57) ABSTRACT

The present disclosure relates to an organic compound having the following structure, and an organic light emitting diode (OLED) and an organic light emitting device including the organic compound. The organic compound includes an electron donor moiety separated from an electron acceptor moiety, thus has delayed fluorescent properties. Applying the organic compound into an emissive layer makes the OLED and the organic light emitting device can allows the OLED and the organic light emitting device to improve their luminous efficiency.

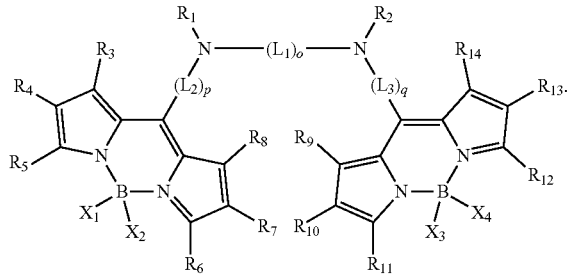

22 Claims, 10 Drawing Sheets

ORGANIC COMPOUND, ORGANIC LIGHT EMITTING DIODE AND ORGANIC LIGHT EMITTING DEVICE INCLUDING THE COMPOUND

CROSS-REFERENCE TO RELATED APPLICATIONS

This application claims the priority benefit under 35 U.S.C. § 119(a) of Korean Patent Application No. 10-2019-0155567, filed in the Republic of Korea on Nov. 28, 2019, which is incorporated herein by reference in its entirety.

BACKGROUND

Technical Field

The present disclosure relates to an organic compound, and more specifically, to an organic compound having excellent luminous properties, an organic light emitting diode and an organic light emitting device including the compound.

Discussion of the Related Art

As display devices have become larger, there exists a need for a flat display device with a lower space requirement. Among the flat display devices used widely at present, organic light emitting diodes (OLEDs) are rapidly replacing liquid crystal display devices (LCDs).

The OLED can be formed as a thin film having a thickness less than 2000 Å and can be implement unidirectional or bidirectional images as electrode configurations. In addition, OLEDs can be formed on a flexible transparent substrate such as a plastic substrate so that OLED can implement a flexible or foldable display with ease. Moreover, the OLED can be driven at a lower voltage of 10 V or less. Besides, the OLED has relatively lower power consumption for driving compared to plasma display panels and inorganic electroluminescent devices, and the color purity of the OLED is very high. Particularly, the OLED can implement red, green and blue colors, thus it has attracted a lot of attention as a light emitting device.

In the OLED, when electrical charges are injected into an emitting material layer between an electron injection electrode (i.e., cathode) and a hole injection electrode (i.e., anode), electrical charges are recombined to form excitons, and then emit light as the recombined excitons are shifted to a stable ground state. Conventional fluorescent materials have low luminous efficiency because only singlet exciton is involved in the luminescence process. On the other hand, conventional phosphorescent materials in which triplet exciton as well as singlet exciton can be involved in the luminescence process have exhibited high luminous efficiency compared to the fluorescent materials. However, the metal complex as the representative phosphorescent material has too short luminous lifetime to be applicable into commercial devices.

SUMMARY

Accordingly, embodiments of the present disclosure are directed to an organic compound and an OLED and an organic light emitting device including the organic compound that substantially obviates one or more of the problems due to the limitations and disadvantages of the related art.

An object of the present disclosure is to provide an organic compound having excellent luminous efficiency and color purity, an OLED and an organic light emitting device into which the organic compound is applied.

Additional features and aspects will be set forth in the description that follows, and in part will be apparent from the description, or may be learned by practice of the inventive concepts provided herein. Other features and aspects of the inventive concept may be realized and attained by the structure particularly pointed out in the written description, or derivable therefrom, and the claims hereof as well as the appended drawings.

To achieve these and other aspects of the inventive concepts, as embodied and broadly described, the present disclosure provides an organic compound having the following structure of Chemical Formula 1:

[Chemical Formula 1]

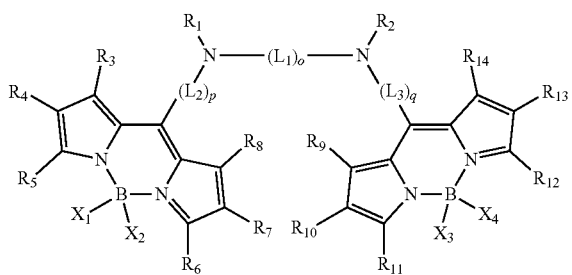

wherein each of $R_1$ and $R_2$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_{14}$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or two adjacent groups among $R_3$ to $R_{14}$ form an unsubstituted or substituted $C_6$-$C_{20}$ fused aromatic ring or an unsubstituted or substituted $C_3$-$C_{20}$ fused hetero aromatic ring; each of $X_1$ to $X_4$ is independently halogen; each of $L_1$ to $L_3$ is independently an unsubstituted or substituted $C_6$-$C_{30}$ arylene group or an unsubstituted or substituted $C_3$-$C_{30}$ hetero arylene group; o is an integer of 1 or 2; and each of p and q is an integer between 0 (zero) to 2.

In another aspect, the present disclosure provides an OLED that comprises a first electrode; a second electrode facing the first electrode; and an emitting material layer disposed between the first and second electrodes, wherein the emitting material layer comprises the organic compound.

In still another aspect, the present disclosure provides an organic light emitting device that comprises a substrate and an OLED disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
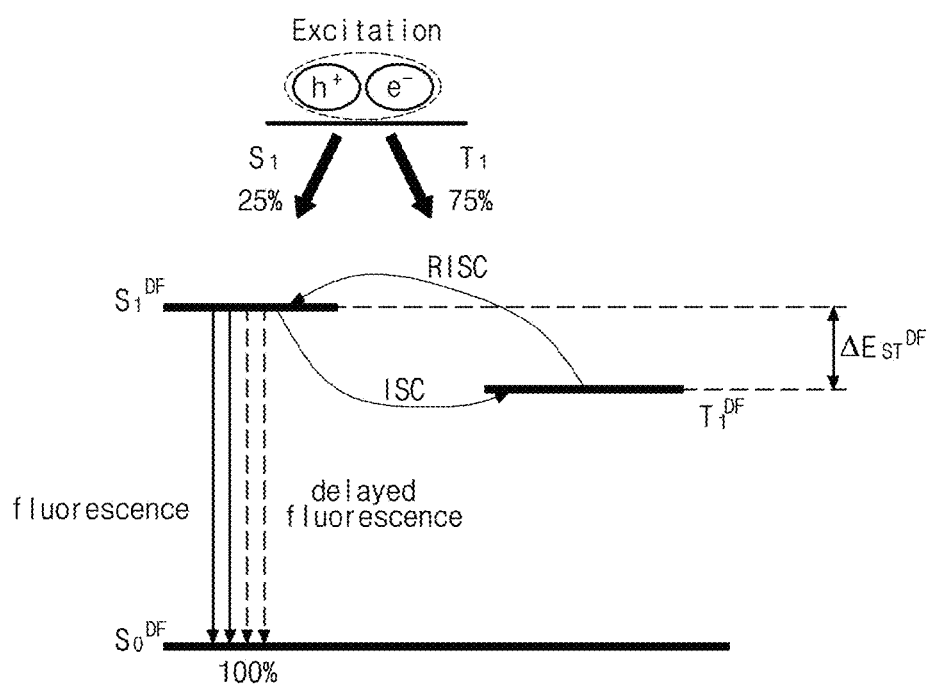
FIG. 1 is a schematic diagram illustrating a luminous mechanism of an organic compound in accordance with the present disclosure.

Reference will now be made in detail to aspects of the disclosure, examples of which are illustrated in the accompanying drawings.

[Organic Compound]

An organic compound applied to an organic light emitting diode (OLED) should have excellent charge affinities and maintain stable properties during driving the OLED. Particularly, the luminous material is the most important factor in determining the luminous efficiency of the OLED. The luminous material should have high luminous efficiency and high charge mobility, and have proper energy levels with regard to other materials applied into the same emissive layer and adjacently disposed emissive layers. The organic compound of the present disclosure includes two boron-dipyrromethene (BODIPY) moieties linked through an amino moiety. The organic compound of the present disclosure may have the following structure of Chemical Formula 1:

[Chemical Formula 1]

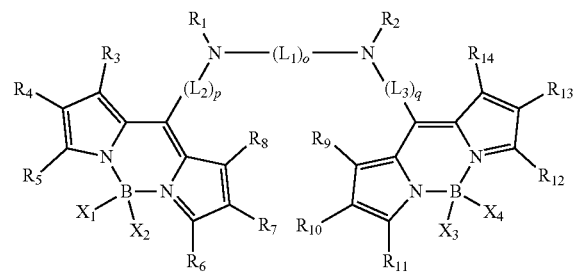

In Chemical Formula 1, each of $R_1$ and $R_2$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_{14}$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or two adjacent groups among $R_3$ to $R_{14}$ form an unsubstituted or substituted $C_6$-$C_{20}$ fused aromatic ring or an unsubstituted or substituted $C_3$-$C_{20}$ fused hetero aromatic ring; each of $X_1$ to $X_4$ is independently halogen; each of $L_1$ to $L_3$ is independently an unsubstituted or substituted $C_6$-$C_{30}$ arylene group or an unsubstituted or substituted $C_3$-$C_{30}$ hetero arylene group; o is an integer of 1 or 2; and each of p and q is an integer between 0 (zero) to 2.

As used herein, the term 'unsubstituted" means that hydrogen is linked, and in this case, hydrogen comprises protium, deuterium and tritium.

As used herein, the term "substituted" means that the substitution group comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term 'hetero" in such as "a hetero aromatic ring", "a hetero cycloalkyene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" means that at least one carbon atom, for example 1-5 carbons atoms, constituting an aromatic ring or an alicyclic ring is substituted at least one hetero atom selected from the group consisting of N, O, S, P and combination thereof.

In Chemical Formula 1, each of the BODIPY moieties functions as an electron acceptor and the amino moiety functions as an electron donor. The BODIPY moieties as an electron acceptor is spatially separated from the amino moiety as an electron donor by two linker groups $L_1$ and $L_2$. The organic compound having the structure of Chemical Formula 1 may have delayed fluorescent properties.

In one exemplary aspect, the $C_6$-$C_{30}$ aromatic group in each of $R_1$ to $R_{14}$ may comprise a $C_6$-$C_{30}$ aryl group, a $C_7$-$C_{30}$ aryl alkyl group, a $C_6$-$C_{30}$ aryloxy group and a $C_6$-$C_{30}$ aryl amino group. The $C_3$-$C_{30}$ hetero aromatic group in each of $R_1$ to $R_{14}$ may comprise a $C_3$-$C_{30}$ hetero aryl group, a $C_4$-$C_{30}$ hetero aryl alkyl group, a $C_3$-$C_{30}$ hetero aryloxyl group and a $C_3$-$C_{30}$ hetero aryl amino group.

In one exemplary aspect, the $C_6$-$C_{30}$ aryl group in each of $R_1$ to $R_{14}$ or substituted to $R_1$ to $R_{14}$ may comprise independently, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzophenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl.

In another exemplary aspect, the $C_3$-$C_{30}$ hetero aryl group in each of $R_1$ to $R_{14}$ or substituted to $R_1$ to $R_{14}$ may comprise independently, but is not limited to, an unfused or fused hetero aryl group such as pyrrolyl, pyridyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, phtheridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzothieno-benzo-furanyl, benzothieno-dibenzo-furanyl, xanthne-linked spiro acridinyl, dihydroacridinyl substituted with at least one $C_1$-$C_{10}$ alkyl and N-substituted spiro fluorenyl.

For example, when two adjacent groups among $R_3$ to $R_{14}$ form the aryl ring or the hetero aryl ring, the newly formed aryl ring or the hetero aryl ring may comprise, but is not limited to, a benzene ring, a furan ring, a thiophene ring, a pyridine ring, an indene ring and/or an indole ring. In this case, each of the aryl ring and the hetero aryl ring may be independently unsubstituted or substituted with at least one group selected from a $C_1$-$C_{10}$ alkyl group, a $C_6$-$C_{30}$ aryl group and a $C_3$-$C_{30}$ hetero aryl group.

As an example, each of the $C_6$-$C_{30}$ aromatic group and the $C_3$-$C_{30}$ hetero aromatic ring in $R_1$ to $R_{14}$ may be independently unsubstituted or substituted with at least one group selected from a $C_1$-$C_{10}$ alkyl group, a $C_6$-$C_{30}$ aryl group and a $C_3$-$C_{30}$ hetero aryl group.

In addition, each of $L_1$ to La may be an unsubstituted or substituted $C_6$-$C_{30}$ arylene group and an unsubstituted or substituted $C_3$-$C_{30}$ hetero arylene group each of which corresponds to the aryl group and the hetero aryl group as described above, respectively. For example, each of the arylene group and the hetero arylene group may be unsubstituted or substituted with at least one group selected from a $C_1$-$C_{10}$ alkyl group, a $C_6$-$C_{30}$ aryl group and a $C_3$-$C_{30}$ hetero aryl group.

In one exemplary aspect, each of the aryl group or the hetero aryl group in each of $R_1$ to $R_{14}$ or substituted to $R_1$ to $R_{14}$ and each of the arylene group or the hetero arylene group in each of $L_1$ to $L_3$ may include independently one to three aromatic or hetero aromatic ring. When the number of aromatic or the hetero aromatic ring in each of $R_1$ to $R_{14}$ or substituted to $R_1$ to $R_{14}$ and in each of $L_1$ to $L_3$ becomes larger, the conjugated structure among the whole molecule is too long, thus the energy bandgap of the organic compound may be significantly reduced.

As an example, the aryl group or the hetero aryl group in each of $R_1$ to $R_{14}$ or substituted to $R_1$ to $R_{14}$ may comprise, but is not limited to, phenyl, naphthyl, anthracenyl, pyridyl, benzo-furanyl, dibenzo-furanyl, benzo-thiophenyl, dibenzo-thiophenyl, carbazolyl, acridinyl, phenazinyl, phenoxazinyl and/or phenothiazinyl. The arylene group or the hetero arylene group in each of $L_1$ to $L_3$ may comprise, but is not limited to, phenylene, biphenylene, naphthylene, anthracenylene, bezno-furanlyene, dibenzo-furanylene, benzo-thiophenylene, dibenzo-thiophenylene, carbazolylene, acridinylene, phenazinylene, phenoxazinylene and/or phenothiazinylene.

The organic compound having the structure of Chemical Formula 1 may be used as a dopant in an emissive layer and may have delayed fluorescent properties. An OLED includes a hole injection layer (anode), an electron injection layer (cathode) and an emissive layer disposed between the anode and the cathode. In order to increase luminous efficiency, the emissive layer may comprise a hole injection layer (HIL), a hole transport layer (HTL), an emitting material layer (EML), an electron transport layer (ETL) and an electron injection layer (EIL) each of which is disposed sequentially on the hole injection layer. When the holes injected from the anode and the electrons injected from the cathode are recombined to form excitons as an excited state, and then the OLED emits light as the unstable excitons shifted to the stable ground state. External quantum efficiency (EQE, next) of the luminous material in an EML can be determined by four factors, i.e., exciton generation efficiency (singlet/triplet ratio), charge balance factor, radiative efficiency, and out-coupling efficiency.

When holes and electrons meet to form exciton, singlet exciton with a paired spin state and triplet exciton with an unpaired spin state is generated in a ratio of 1:3 in theory. Since only the singlet exciton participates in luminescence and the remaining 75% triplet excitons cannot participate in luminescence in the fluorescent material, the singlet/triplet ratio is 0.25 in the conventional fluorescent material. Therefore, when taking all four factors into account, the maximum luminous efficiency of the OLED using the conventional fluorescent material is only about 5%.

On the other hand, phosphorescent materials have a luminescent mechanism that converts both the singlet and triplet excitons to light. Phosphorescent materials convert singlet exciton into triplet exciton through intersystem crossing (ISC). Therefore, when using phosphorescent materials using both singlet exciton and triplet exciton, it is possible to improve the low luminous efficiency of the fluorescent materials. However, when the organic aromatic compound has increased conjugated structure or fused ring structure, the excited triplet energy level of the compound becomes radically low, thus the organic molecules that can be used as phosphorescent host are extremely limited. In addition, the phosphorescent host having wide energy bandgap result in delayed of the charge injection and transportation, thus the OLED including the host showed increased driving voltage and deteriorated luminous lifetime.

Delayed fluorescent material, which can solve the problems accompanied by the conventional art fluorescent and/or phosphorescent materials, has been developed. Representative delayed fluorescent material is a thermally-activated delayed fluorescent (TADF) material. The luminous mechanism of the delayed fluorescent material will be explained with referring to FIG. 1, which is a schematic diagram illustrating a luminous mechanism of an organic compound of the present disclosure. As illustrated in FIG. 1, the excitons of singlet energy level $S_1^{DF}$ as well as the excitons of triplet energy level $T_1^{DF}$ in the delayed fluorescent material DF can be transferred to an intermediate energy level state, i.e. ICT (intramolecular charge transfer) state, and then the intermediate stated excitons can be shifted to a ground state ($S_0^{DF}$; $S_1^{DF} \rightarrow ICT \leftarrow T_1^{DF}$).

Since the compound that can be ICT state has little orbital overlaps between HOMO and LUMO, there is little interaction between the HOMO state and the LUMO state. As a result, the changes of spin states of electrons do not have an influence on other electrons, and a new charge transfer band (CT band) that does not follow the selection rule is formed within the delayed fluorescent material. In case of driving an OLED that includes the delayed fluorescent material DF, both 25% singlet excitons and 75% triplet excitons are converted to ICT state by heat or electrical field, and then the converted excitons drops to the ground state $S_0^{DF}$ with luminescence. Therefore, the delayed fluorescent material DF may have 100% internal quantum efficiency in theory.

The delayed fluorescent material DF must has an energy level bandgap $\Delta E_{ST}^{DF}$ equal to or less than about 0.3 eV, for example, from about 0.05 to about 0.3 eV, between the excited singlet energy level $S_1^{DF}$ and the excited triplet energy level $T_1^{DF}$. The material having little energy level bandgap $\Delta E_{ST}^{DF}$ between the singlet energy level $S_1^{DF}$ and the triplet energy level $T_1^{DF}$ can exhibit common fluorescence with Inter system Crossing (ISC) in which the excitons of singlet energy level $S_1^{DF}$ can be shifted to the ground state, as well as delayed fluorescence with Reverser Inter System Crossing (RISC) in which the excitons of triplet energy level $T_1^{DF}$ can be transferred upwardly to the excitons of singlet energy level $S_1^{DF}$, and then the exciton of singlet energy level $S_1^{DF}$ transferred from the triplet energy level $T_1^{DF}$ can be shifted to the ground state $S_0^{DF}$.

As illustrated in Chemical Formula 1, the organic compound is a dimeric compound including two BODIPY moieties. The BODIPY moieties of the electron acceptor are spaced apart from the amino moiety of the electron donor by two linkers $L_1$ and $L_2$. As the distance between the electron acceptor and the electron donor increase, the organic compound having the structure of Chemical Formula 1 has little orbital overlaps between HOMO (Highest Occupied Molecular Orbital) state and LUMO (Lowest Unoccupied Molecular Orbital) state.

In addition, as the sterical hindrance between the BODIPY moieties of the electron acceptor and the amino moiety of the electron donor becomes large, conjugated structure between these moieties is limited. As the molecules are easily separated to HOMO energy state and LUMO energy state and dipole between the BODIPY moieties and the amino moiety is formed, a dipole moment within the molecule increases and luminous efficiency of the organic compound is improved. As the distance between the electron acceptor and the electron donor increases, the organic compound has little overlaps between the HOMO state and the LUMO state in the molecules, thus the energy level bandgap $\Delta E_{ST}^{DF}$ between the excited singlet energy level $S_1^{DF}$ and the excited triplet energy level $T_1^{DF}$ can be reduced. Since each of two BODIPY moieties as the electron acceptor includes a rigid fused hetero aromatic ring, the organic compound has a limited three dimensional conformation. When the organic compound emits light, there is no energy loss owing to modification of three dimensional conformation of the whole molecule, and the photoluminescence spectrum can be limited in specific ranges, thus it is possible to realize high color purity.

In addition, an excited triplet energy level of the organic compound having the structure of Chemical Formula 1 may be lower than an excited triplet energy level of the conventional phosphorescent materials, and have energy bandgap narrower than that of the phosphorescent materials. Unlikely the conventional phosphorescent materials, it is not required for organic compound having high triplet energy level and wide energy bandgap to be used as the host. Also, the charge injection and transportation delay issue owing to using wide energy bandgap host can be prevented.

In one exemplary aspect, each of at least four groups among $R_3$ to $R_8$ and at least four groups among $R_9$ to $R_{14}$ can be substituted to the BODIPY core may be independently an unsubstituted or substituted $C_1$-$C_{10}$ alkyl group. In this case, the organic compound having the structure of Chemical Formula 1 may emit green light, for example, may have, but is not limited to, a maximum photoluminescence wavelength (PL $\lambda_{max}$) between about 530 nm and about 580 nm and a maximum absorption wavelength (Abs. $\lambda_{max}$) between about 510 nm and about 570 nm. Also, each of $L_1$ to $L_3$ may be independently an unsubstituted or substituted $C_6$-$C_{30}$ arylene group, and each of p and q may be independently an integer of 1 or 2. For example, the organic compound emitting green light may comprise anyone having the following structure of Chemical Formula 2:

[Chemical Formula 2]

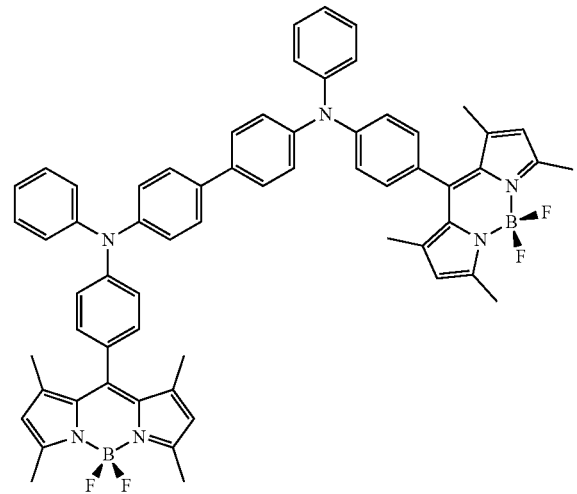

1-1

1-2
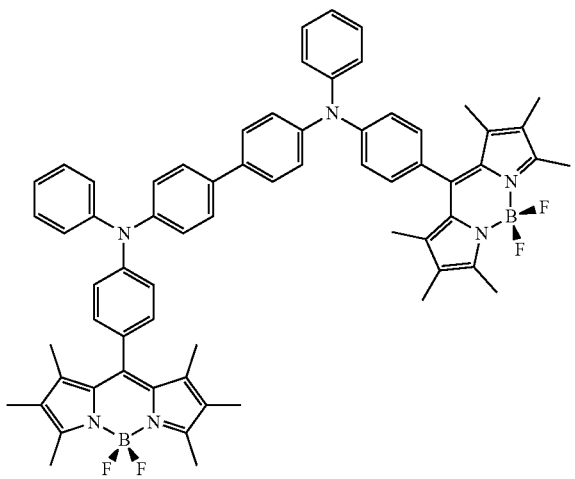
1-3
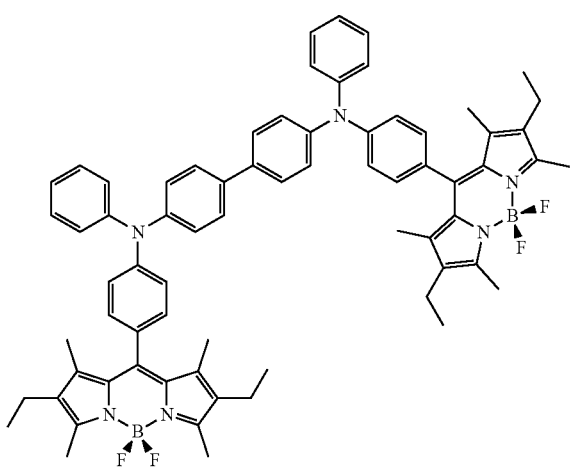
1-4
1-5
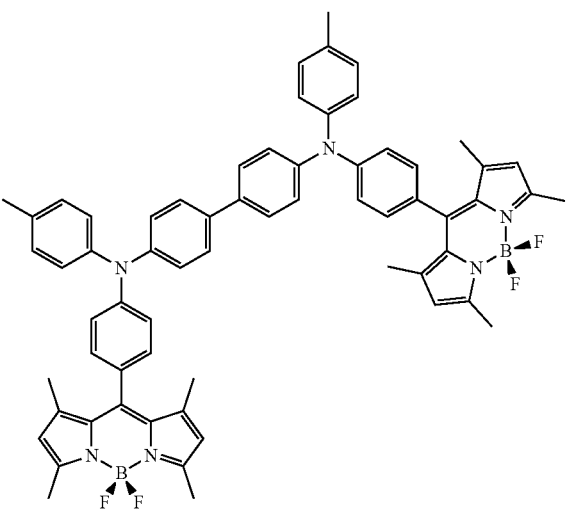
1-6
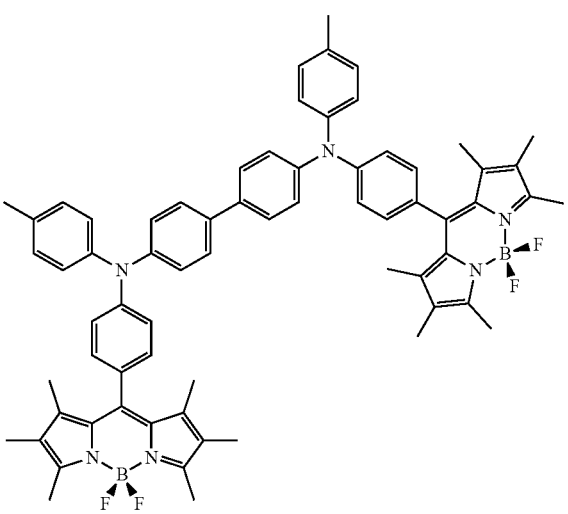
1-7
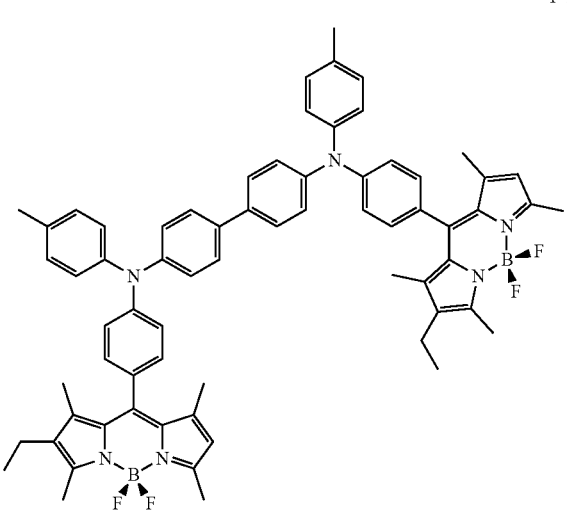

1-8
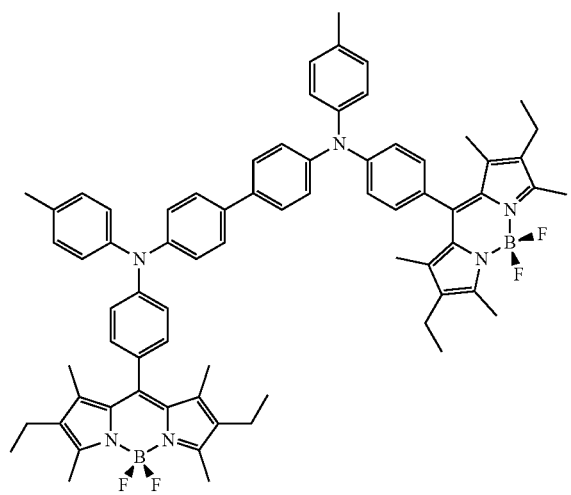
1-9
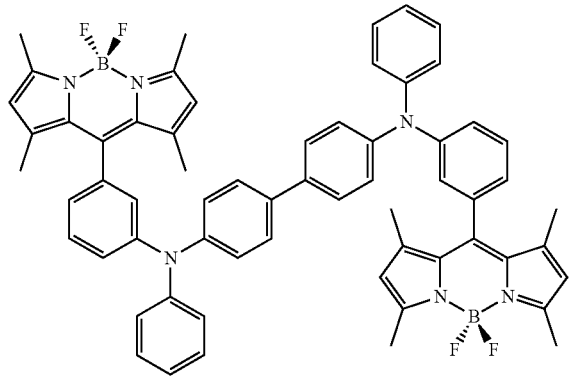
1-10
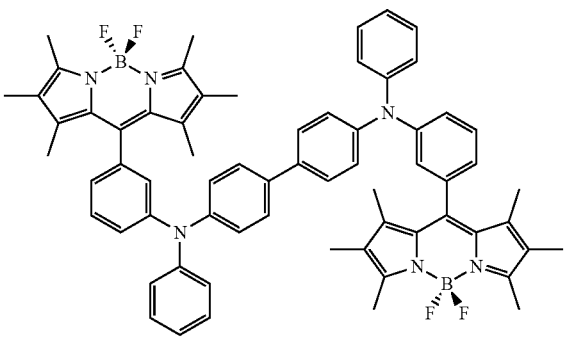
1-11
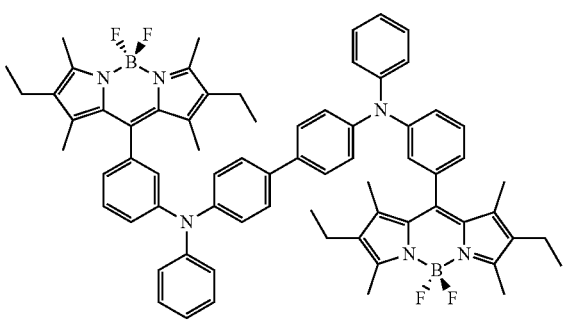

-continued 1-12
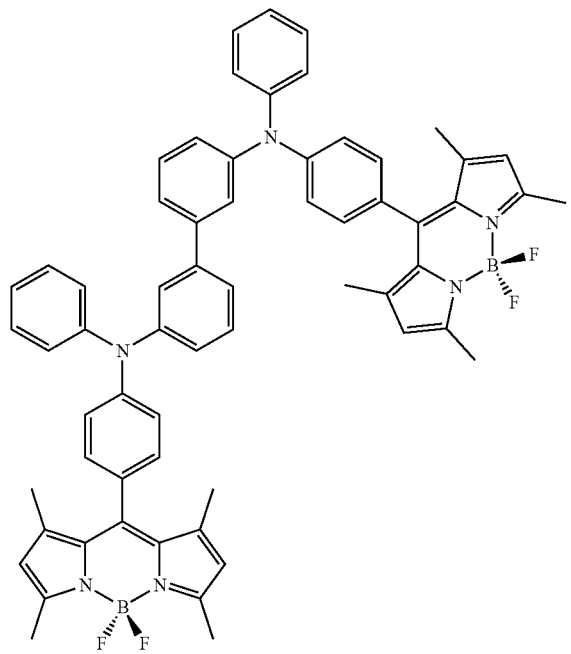

1-14

1-15
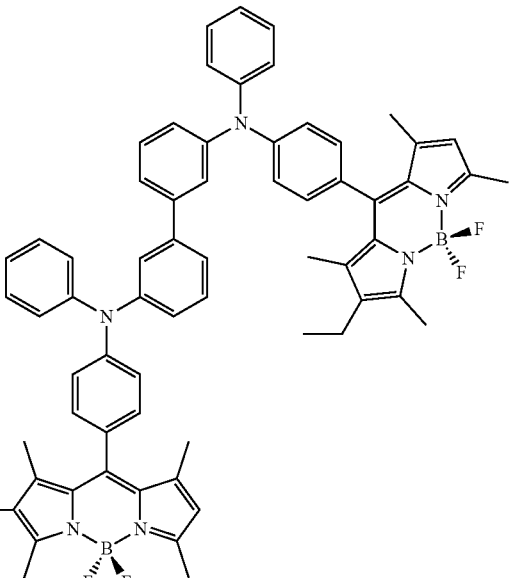

1-16

In another exemplary aspect, each of at least two groups among $R_3$, $R_5$, $R_7$ and $R_8$ and at least two groups among $R_9$, $R_{11}$, $R_{12}$ and $R_{14}$ that can be substituted to the BODIPY core may be independently an unsubstituted or substituted $C_6$-$C_{20}$ aryl group or an unsubstituted or substituted $C_3$-$C_{20}$ hetero aryl group. In this case, the organic compound having the structure of Chemical Formula 1 may emit red light, for example, may have, but is not limited to, a PL $\lambda_{max}$ between about more than 580 nm and about 620 nm and a Abs. $\lambda$max between about 550 nm and about 580 nm. Also, each of $L_1$ to $L_3$ may be independently an unsubstituted or substituted $C_6$-$C_{30}$ arylene group, and each of p and q may be independently an integer of 1 or 2. For example, the organic compound emitting red light may comprise anyone having the following structure of Chemical Formula 3:

[Chemical Formula 3]
[Chemical Formula [3]]
2-1
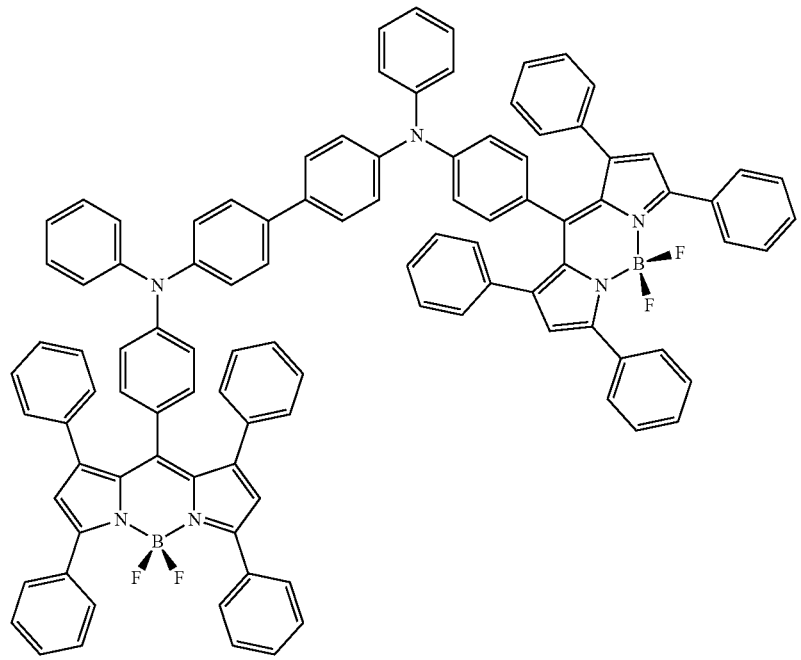
2-2
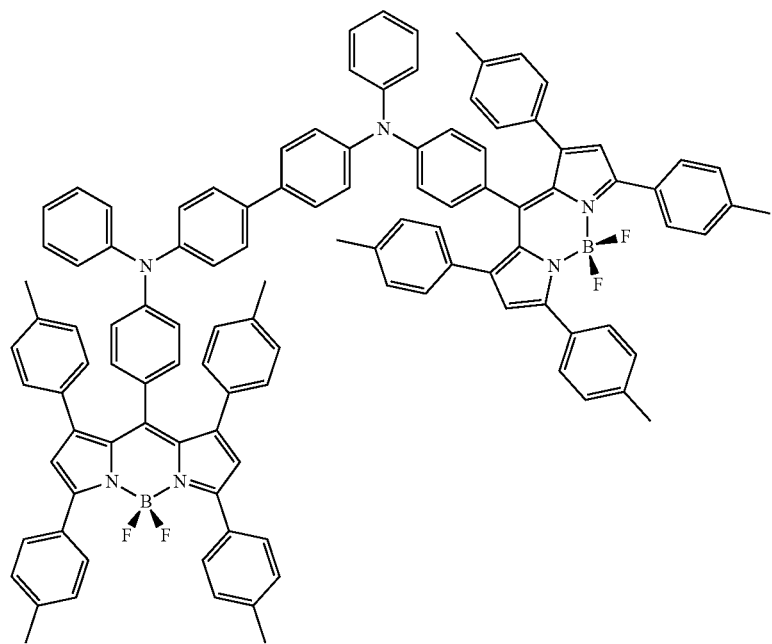

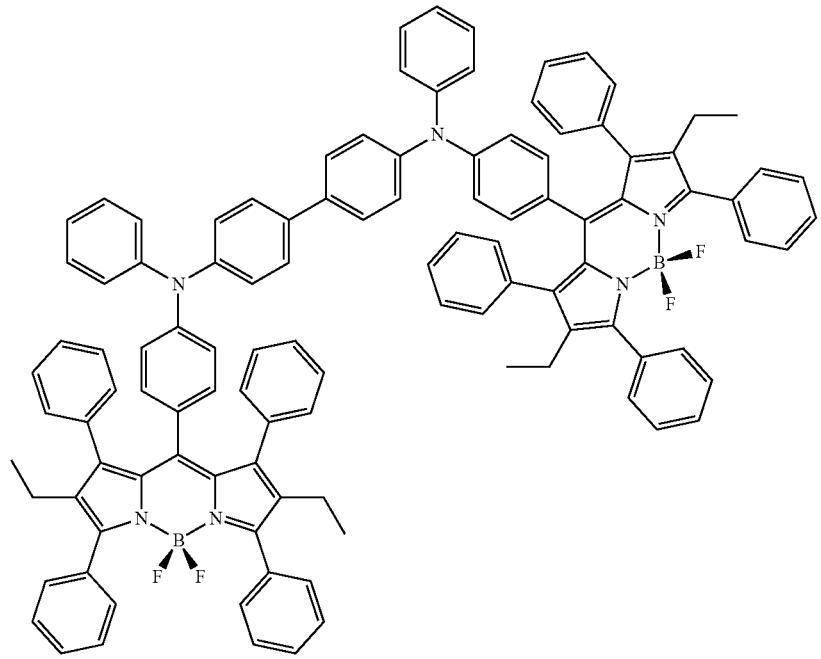
2-3
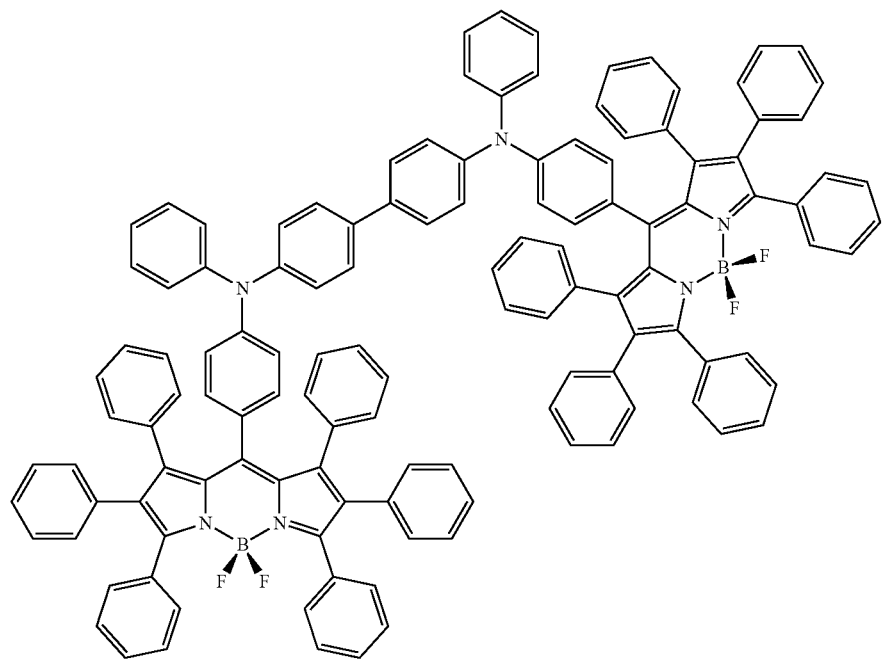
2-4

2-5
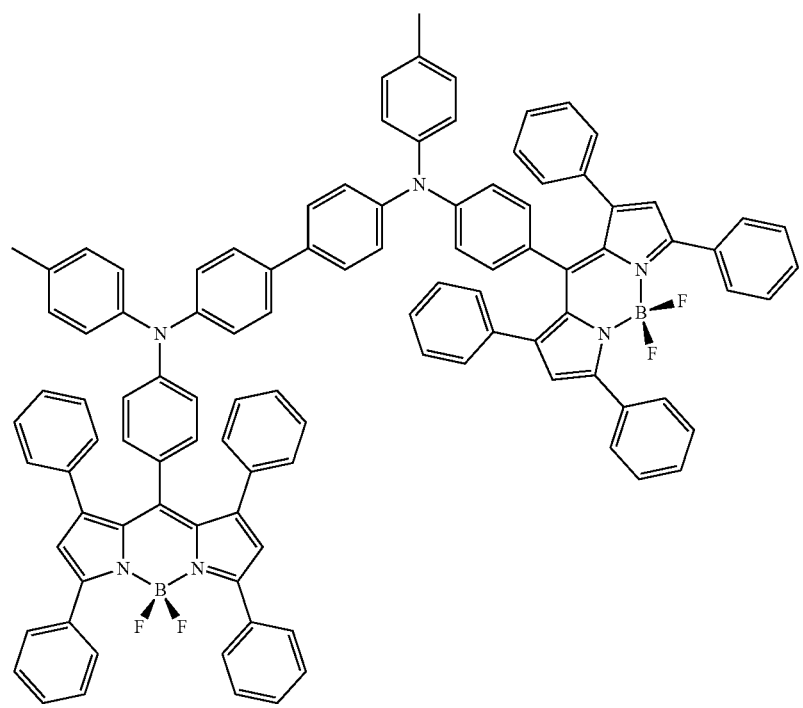
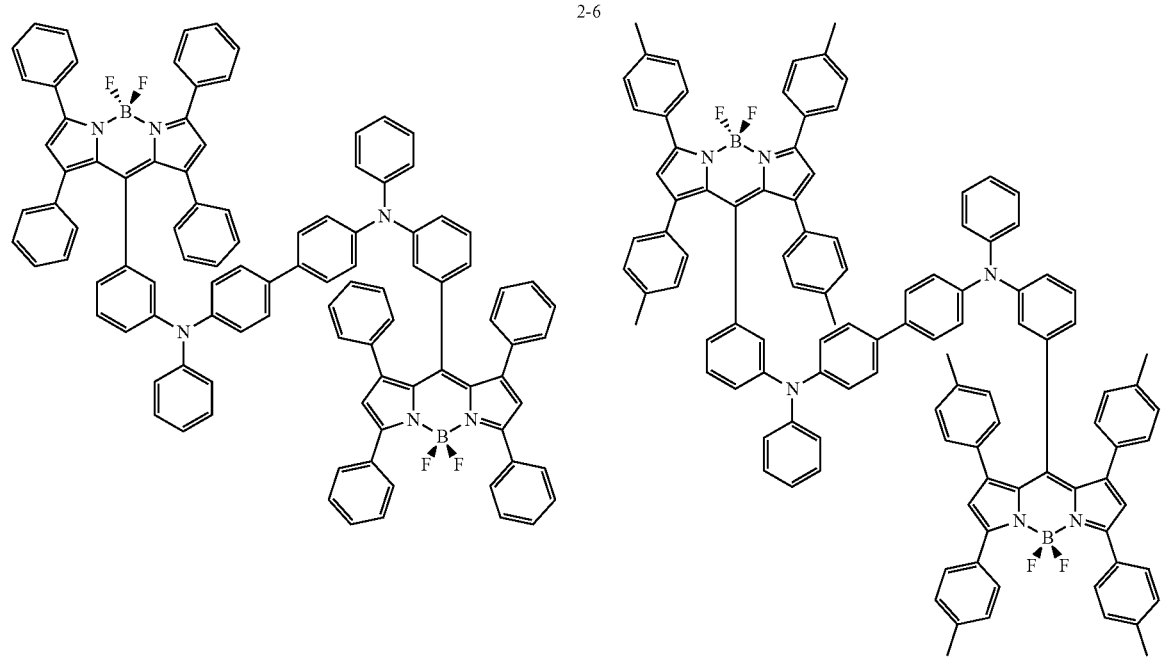

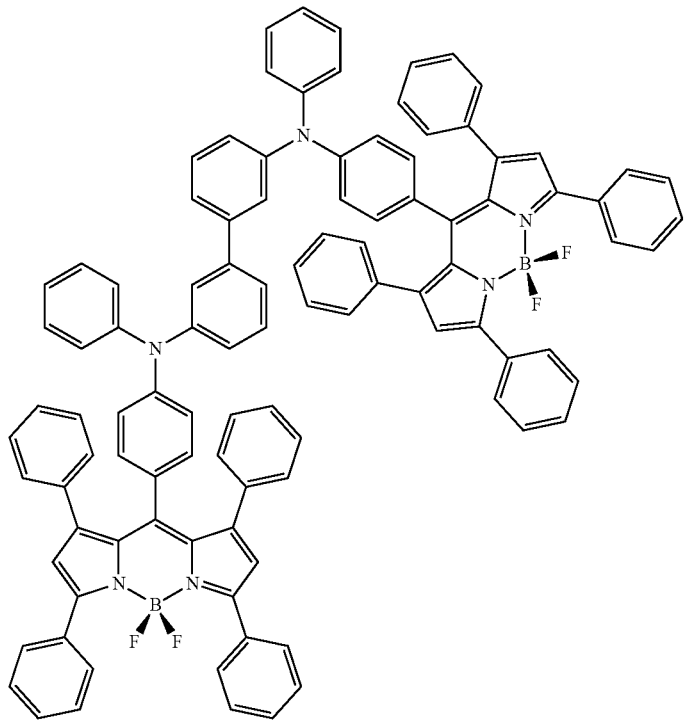

[Organic Light Emitting Device and OLED]

Figure 2:
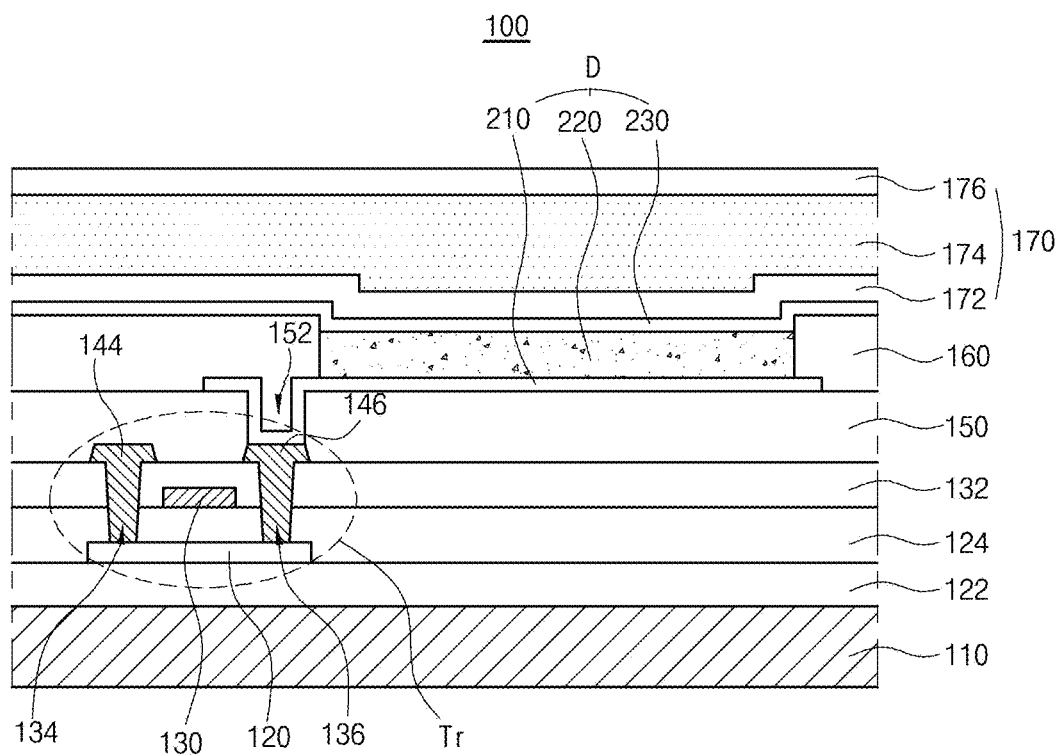
FIG. 2 is a schematic cross-sectional view illustrating an organic light emitting display device of the present disclosure.

The organic compound having the structure of Chemical Formulae 1 to 3 may be applied into an EML of the OLED, so that it can lower the driving voltage, enhance the color purity and improve the luminous efficiency of the OLED. The OLED of the present disclosure may be applied to an organic light emitting device such as an organic light emitting display device or an organic light emitting illumination device. An organic light emitting display device including the OLED will be explained. FIG. 2 is a schematic cross-sectional view of an organic light emitting display device of the present disclosure.

As illustrated in FIG. 2, the organic light emitting display device 100 includes a substrate 110, a thin-film transistor Tr on the substrate 110, and an organic light emitting diode (OLED) D connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the OLED D are arranged, form an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shield pattern may be disposed under the semiconductor layer 120, and the light-shield pattern can prevent light from being incident toward the semiconductor layer 120, and thereby, preventing the semiconductor layer 120 from being deteriorated by the light.

Alternatively, the semiconductor layer 120 may include, but is not limited to, polycrystalline silicon. In this case, opposite edges of the semiconductor layer 120 may be doped with impurities.

A gate insulating layer 124 formed of an insulating material is disposed on the semiconductor layer 120. The gate insulating layer 124 may include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 formed of an insulating material is disposed on the gate electrode 130 with covering over an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are formed of conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line and a data line, which cross each other to define a pixel region, and a switching element, which is connected to the gate line and the data line is, may be further formed in the pixel region of FIG. 1. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 100 may include a color filter that comprises dyes or pigments for transmitting specific wavelength light of light emitted from the OLED D. For example, the color filter can transmit light of specific wavelength such as red (R), green (G) and/or blue (B). Each of red, green, and blue color filter may be formed separately in each pixel region. In this case, the organic light emitting display device 100 can implement full-color through the color filter.

For example, when the organic light emitting display device 100 is a bottom-emission type, the color filter may be disposed on the interlayer insulating layer 132 with corresponding to the OLED D. Alternatively, when the organic light emitting display device 100 is a top-emission type, the color filter may be disposed over the OLED D, that is, a second electrode 230.

In addition, the organic light emitting device 100 may comprise a color conversion layer (not shown) converting a specific wavelength light among the light emitted from the OLED D to a long wavelength range light. The color conversion layer may comprise inorganic luminescent particles such as quantum dots or quantum rods. For example, the color conversion layer may be disposed over or below the OLED D.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The OLED D includes a first electrode 210 that is disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a top-emission type, a reflective electrode or a reflective layer may be disposed under the first electrode 210. For example, the reflective electrode or the reflective layer may include, but are not limited to, aluminum-palladium-copper (APC) alloy. In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered structure of an emitting material layer (EML). Alternatively, the emissive layer 220 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 3, 5, 7 and 9). In one aspect, the emissive layer 220 may have one emitting unit. Alternatively, the emissive layer 220 may have multiple emitting units to form a tandem structure.

The emissive layer 220 comprises anyone having the structure of Chemical Formulae 1 to 3. As an example, the organic compound having the structure of Chemical Formulae 1 to 3 may be applied into a dopant in the EML, and in this case, the EML may further comprise a host and optionally at least one other luminous material.

The second electrode 230 is disposed over the substrate 110 above which the emissive layer 220 is disposed. The second electrode 230 may be disposed over a whole display area and may include a conductive material with a relatively low work function value compared to the first electrode 210. The second electrode 230 may be a cathode. For example, the second electrode 230 may include, but is not limited to, aluminum (Al), magnesium (Mg), calcium (Ca), silver (Ag), alloy thereof or combination thereof such as aluminum-magnesium alloy (Al—Mg).

In addition, an encapsulation film 170 may be disposed over the second electrode 230 in order to prevent outer moisture from penetrating into the OLED D. The encapsulation film 170 may have, but is not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 110 and the cover window may have a flexible property, thus the organic light emitting display device 100 may be a flexible display device.

Figure 3:
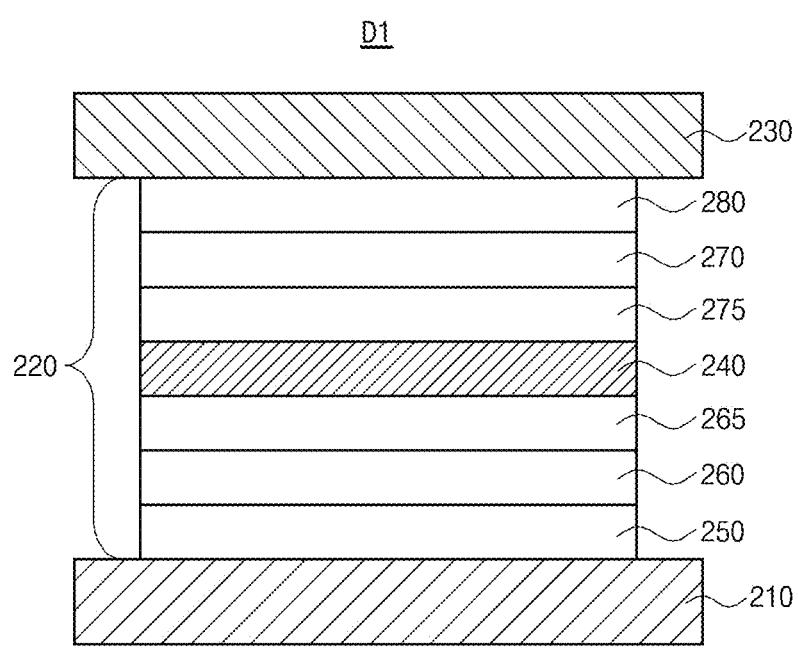
FIG. 3 is a schematic cross-sectional view illustrating an OLED in accordance with an exemplary aspect of the present disclosure.

Now, we will describe the OLED in more detail. FIG. 3 is a schematic cross-sectional view illustrating an OLED in accordance with an exemplary aspect of the present disclosure. As illustrated in FIG. 2, the OLED D1 includes first and second electrodes 210 and 230 facing each other and an emissive layer 220 having single emitting unit disposed between the first and second electrodes 210 and 230. In one exemplary aspect, the emissive layer 220 comprises an EML 240 disposed between the first and second electrodes 210 and 230. Also, the emissive layer 220 further comprises a HIL 250 and a HTL 260 each of which is disposed sequentially between the first electrode 210 and the EML 240, and an ETL 270 and an EIL 280 each of which is disposed sequentially between the EML 240 and the second electrode 230. Alternatively, the emissive layer 220 may further comprise a first exciton blocking layer, i.e. an EBL 265 disposed between the HTL 260 and the EML 240 and/or a second exciton blocking layer, i.e. a HBL 275 disposed between the EML 240 and the ETL 270.

The first electrode 210 may be an anode that provides a hole into the EML 240. The first electrode 210 may include, but is not limited to, a conductive material having a relatively high work function value, for example, a transparent conductive oxide (TCO). In an exemplary aspect, the first electrode 210 may include, but is not limited to, ITO, IZO, ITZO, SnO, ZnO, ICO, AZO, and the like.

The second electrode 230 may be a cathode that provides an electron into the EML 240. The second electrode 230 may include, but is not limited to, a conductive material having a relatively low work function values, i.e., a highly reflective material such as Al, Mg, Ca, Ag, alloy thereof, combination thereof, and the like.

The EML 240 may comprise a first compound H and a second compound DF. The first compound H may be a host and the second compound DF may be a delayed fluorescent material (dopant). For example, the organic compound having the structure of Chemical Formulae 1 to 3 may be used the second compound in the EML 240.

For example, the first compound H of the host in the EML 240 may comprise, but is not limited to, 9-(3-(9H-carbazol-9-yl)phenyl)-9H-carbazole-3-carbonitrile (mCP-CN), 4,4'-bis(N-carbazolyl)-1,1'-biphenyl (CBP), 3,3'-bis(N-carbazolyl)-1,1'-biphenyl (mCBP), 1,3-Bis(carbazol-9-yl)benzene (mCP), Bis[2-(diphenylphosphino)phenyl] ether oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-biphey1]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole and/or 4-(3-(2-triphenylen-2-yl)phenyl)-dibenzothiophene.

As described above, the organic compound having the structure of Chemical Formulae 1 to 3 includes the BODIPY moieties of electron acceptor spaced apart from the amino moiety of the electron donor, and has limited conjugated conformation between those moieties, thus has delayed fluorescent property. As illustrated in FIG. 1, when the organic compound having the delayed fluorescent property is introduced into the EML 240 as the second compound DF, both excitons of 25% excited singlet energy level $S_1^{DF}$ and excitons of 75% excited triplet energy level $T_1^{DF}$ are transferred to the ICT state, and then the excitons drops to the stable ground state S0, thus its internal quantum efficiency is improved.

The second compound DF having the delayed fluorescent property should have an energy bandgap $\Delta E_{ST}^{DF}$ between the excited singlet energy level $S_1^{DF}$ and the excited triplet energy level $T_1^{DF}$ of about 0.3 eV or less, for example, between about 0.05 eV and about 0.3 eV so that both the single excitons and the triplet excitons can be transferred. Since the organic compound having the structure of Chemical Formulae 1 to 3 has little energy bandgap between the singlet state and the triplet state, it can exhibit fluorescence as the exciton energy of the original singlet state drops to the ground state to exhibit fluorescence, and exhibit delayed fluorescence as the triplet exciton is converted upwardly its singlet state by RISC and then the converted exciton is shifted to the ground state.

Referring back to FIG. 3, the HIL 250 and the HTL 260 may be disposed sequentially between the first electrode 210 and the EML 240. The HIL 250 is disposed between the first electrode 210 and the HTL 260 and improves an interface property between the inorganic first electrode 210 and the organic HTL 260. In one exemplary aspect, the HIL 250 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 250 may be omitted in compliance with a structure of the OLED D1.

The HTL 260 is disposed adjacently to the EML 240 between the first electrode 210 and the EML 240. In one exemplary aspect, the HTL 260 may include, but is not limited to, N,N'-Diphenyl-N,N'-bis(3-methylphenyl)-1,1'-biphenyl-4,4'-diamine (TPD), NPB, CBP, Poly[N,N'-bis(4-butylphenyl)-N,N'-bis(phenyl)-benzidine] (Poly-TPD), Poly [(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl]cyclohexane (TAPC), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The ETL 270 and the EIL 280 may be disposed sequentially between the EML 240 and the second electrode 230. The ETL 270 includes a material having high electron mobility so as to provide electrons stably with the EML 240 by fast electron transportation. In one exemplary aspect, the ETL 270 may comprise, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 may comprise, but is not limited to, tris-(8-hydroxyquinoline aluminum (Alq$_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ) and/or TSPO1.

The EIL 280 is disposed between the second electrode 230 and the ETL 270, and can improve physical properties of the second electrode 230 and therefore, can enhance the lifetime of the OLED D1. In one exemplary aspect, the EIL 280 may comprise, but is not limited to, an alkali halide such as LiF, CsF, NaF, $BaF_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D1 may have short lifetime and reduced luminous efficiency. In order to prevent these phenomena, the OLED D1 in accordance with this aspect of the present disclosure may have at least one exciton blocking layer adjacent to the EML 240.

For example, the OLED D1 of the exemplary aspect includes the EBL 265 between the HTL 260 and the EML 240 so as to control and prevent electron transfers. In one exemplary aspect, the EBL 265 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB, 3,5-di(9H-carbazol-9-yl)-N,N-diphenylamine (DCDPA) and/or 3,6-bis(N-carbazolyl)-N-phenylcarbazole.

In addition, the OLED D1 may further include the HBL 275 as a second exciton blocking layer between the EML 240 and the ETL 270 so that holes cannot be transferred from the EML 240 to the ETL 270. In one exemplary aspect, the HBL 275 may comprise, but is not limited to, oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 may comprise a compound having a relatively low HOMO energy level compared to the luminescent materials in EML 240. The HBL 275 may comprise, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof.

Figure 4:
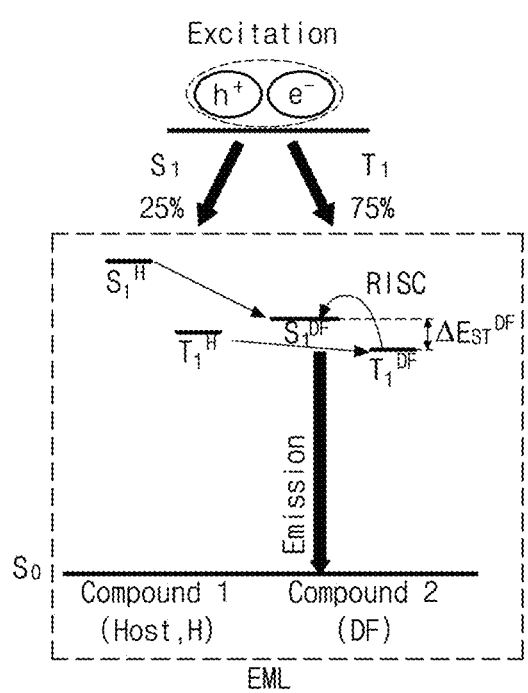
FIG. 4 is a schematic diagram illustrating luminous mechanism by energy level bandgap among luminous materials in accordance with an exemplary aspect of the present disclosure.

When the EML 240 comprise the first compound H of the host and the second compound DF of the organic compound having the structure of Chemical Formulae 1 to 3, it is necessary to adjust energy levels between the first compound H of the host and the second compound DF of the delayed fluorescent material. FIG. 4 is a schematic diagram illustrating luminous mechanism by energy level bandgap among luminous materials in accordance with an exemplary aspect of the present disclosure.

As illustrated in FIG. 4, each of an excited singlet energy level $S_1^H$ and an excited triplet energy level $T_1^H$ of the first compound H of the host in the EML 240 should be higher than each of the excited singlet energy level $S_1^{DF}$ and the excited triplet energy level $T_1^{DF}$ of the second compound DF of the delayed fluorescent material, respectively. As an example, the excited triplet energy level $T_1^H$ of the first compound may be higher than the excited triplet energy level $T_1^{DF}$ of the second compound DF by at least about 0.5 eV, e.g. at least about 0.2 eV.

When each of the excited singlet energy level $S_1^{DF}$ and the excited triplet energy level $T_1^H$ of the first compound H is not high enough than each of the singlet energy level $S_1^{DF}$ and the excited triplet energy level $T_1^{DF}$ of the second compound DF, the exciton at the excited triplet energy level TIDE of the second compound DF may be reversely transferred to the excited triplet energy level $T_1^{DF}$ of the first compound H. In this case, the triplet exciton reversely transferred to the first compound H where the triplet exciton cannot be emitted is quenched as non-emission so that the triplet exciton energy of the second compound DF having the delayed fluorescent property cannot contribute to luminescence. The energy level bandgap $\Delta E_{ST}^{DF}$ between the excited singlet energy level $S_1^{DF}$ and the excited triplet energy level $T_1^{DF}$ of the second compound DF may be equal to or less than about 0.3 eV, for example, between about 0.05 eV and about 0.3 eV so as to implement delayed fluorescence.

In addition, it is necessary to adjust the LUMO and HOMO energy levels of the first and second compounds H and DF so that holes and electrons are injected rapidly into the EML 240 to recombine excitons efficiently. For example, it is preferable that an energy level bandgap ($|HOMO^H - HOMO^{DF}|$) between the HOMO energy level ($HOMO^H$) of the first compound H and the HOMO energy level ($HOMO^{DF}$) of the second compound DF, or an energy level bandgap ($|LUMO^H - LUMO_{DF}|$) between the LUMO energy level ($LUMO^H$) of the first compound H and the LUMO energy level ($LUMO^{DF}$) of the second compound DF may be equal to or less than about 0.5 eV, for example, between about 0.1 eV to about 0.5 eV.

When the EML 240 comprises the first compound H of the host and the second compound DF of the delayed fluorescent material having the structure of Chemical Formulae 1 to 3, exciton energies can be transferred to the second compound DF without energy loss in the luminescence process. Particularly, exciton quenching caused by an interaction between the exciton of the first compound H of the host and peripheral polarons can be minimized, thus the deterioration of the luminous lifetime of the OLED D1 due to the electrical oxidation and photo oxidation can be prevented.

When the EML 240 includes the first compound H of the host and the second compound DF of the delayed fluorescent material, the contents of the second compound DF in the EML 240 may be, but is not limited to, between about 1 wt % and about 50 wt %, preferably between about 10 wt % and about 50 wt %, and more preferably between about 20 wt % and about 40 wt %.

Figure 5:
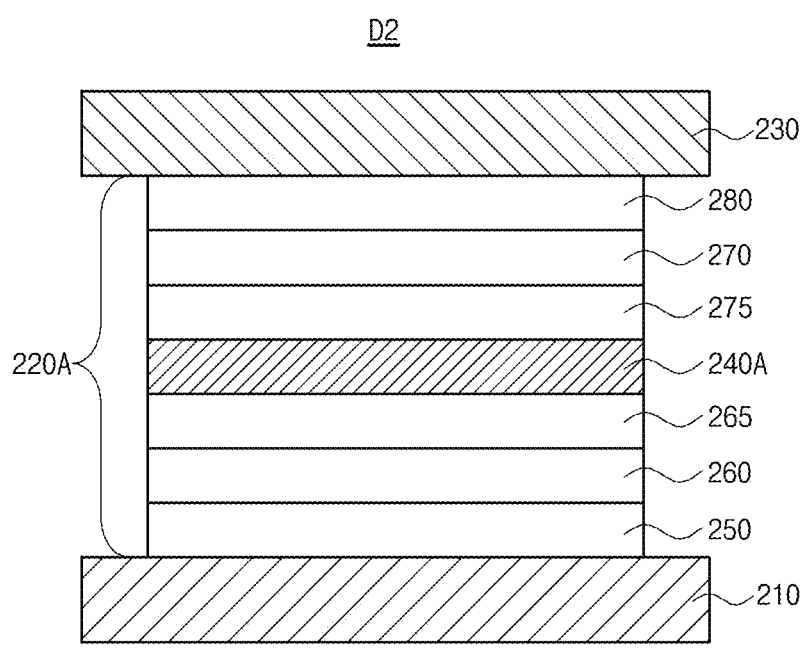
FIG. 5 is a schematic cross-sectional view illustrating an OLED in accordance with another exemplary aspect of the present disclosure.

FIG. 5 is a schematic cross-sectional view illustrating an OLED in accordance with another exemplary aspect of the present disclosure. As illustrated in FIG. 5, the OLED D2 comprises the first electrode 210, the second electrode 230 facing the first electrode 210 and an emissive layer 220A disposed between the first and second electrodes 210 and 230. The emissive layer 220A having single emitting unit comprises an EML 240A. Also, the emissive layer 220A comprise the HIL 250 and the HTL 260 each of which is disposed sequentially between the first electrode 210 and the EML 240A, and the ETL 270 and the EIL 280 each of which is disposed sequentially between the EML 240A and the second electrode 230. Alternatively, the emissive layer 220A may further comprise the EBL 265 disposed between the HTL 260 and the EML 240A and/or the HBL 275 disposed between the EML 240A and the ETL 270. The configurations of the first and second electrodes 210 and 230 as well as other layers except the EML 240A in the emissive layer 220A may be substantially identical to the corresponding electrodes and layers in the OLED D1.

In this aspect, the EML 240A comprise the first compound, the second compound and a third compound. The first compound may be the host, the second compound may be the delayed fluorescent material (first dopant) and the third compound may be fluorescent material (first dopant). The second compound DF may comprise any organic compound having the structure of Chemical Formulae 1 to 3. When the EML 240A further comprises the fluorescent material as well as the delayed fluorescent material, it is possible to realize OLED D2 having much enhanced luminous efficiency by adjusting energy levels among the host and the dopants.

The EML 240 (see, FIG. 3) includes only the first compound H of the host and the second compound DF having the delayed fluorescent property, the second compound DF exhibit maximally 100% internal quantum efficiency in theory, which is equivalent to the conventional phosphorescent material such as metal complexes. However, because of the bond formation between the electron acceptor and the electron donor and conformational twists within the delayed fluorescent material, additional charge transfer transition (CT transition) within the delayed fluorescent material is caused thereby, and the delayed fluorescent material has various geometries. As a result, the delayed fluorescent materials show luminescence spectra having very broad FWHM (full-width at half maximum) in the luminescence process, which results in poor color purity. In addition, the delayed fluorescent material utilizes the triplet exciton energy as well as the singlet exciton energy in the luminescence process with rotating each moiety within its molecular structure, which results in twisted internal charge transfer (TICT). As a result, the luminous lifetime of an OLED including only the delayed fluorescent materials may be reduced owing to weakening of molecular bonding forces among the delayed fluorescent materials.

The EML 240A of this aspect further comprises the third compound FD of fluorescent or phosphorescent material so as to prevent the color purity and the luminous lifetime of the OLED D1 from being deteriorated when the EML includes only the delayed fluorescent material as a dopant. With referring to FIG. 6, the triplet exciton energy of the second compound DF having the delayed fluorescent property is converted upwardly to singlet exciton energy, and then the converted singlet exciton energy of the second compound DF can be transferred to the third compound FD in the same EML 240A via FRET (Forster Resonance Energy Transfer) mechanism to implement hyper fluorescence.

Figure 6:
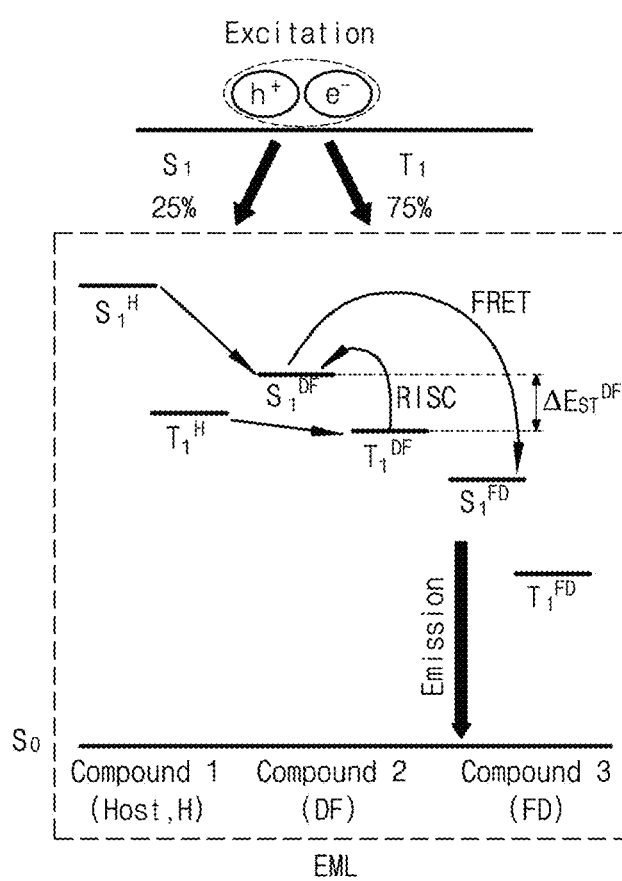
FIG. 6 is a schematic diagram illustrating luminous mechanism by energy level bandgap among luminous materials in accordance with another exemplary aspect of the present disclosure.

When the EML 240A comprise the first compound H of the host, the second compound DF having the delayed fluorescent property and the third compound FD of the fluorescent or phosphorescent material, it is necessary to adjust property the energy levels among those luminous materials. FIG. 6 is a schematic diagram illustrating luminous mechanism by energy level bandgap among luminous materials in accordance with another exemplary aspect of the present disclosure.

As illustrated in FIG. 6, the second compound DF may have the energy level bandgap $\Delta E_{ST}^{DF}$ between the excited singlet energy level $S_1^{DF}$ and the excited triplet energy level $T_1^{DF}$ equal to or less than about 0.3 eV so as to realize delayed fluorescence. The exciton energy generated at the first compound H should be transferred primarily to the second compound DF. To this end, each of the excited singlet energy level $S_1^H$ and the excited triplet energy level $T_1^H$ of the first compound H of the host in the EML 240A is higher than each of the excited singlet energy level $S_1^{DF}$ and the excited triplet energy level $T_1^{DF}$ of the second, respectively. As an example, the excited triplet energy level $T_1^H$ of the first compound H may be higher than the excited triplet energy level $T_1^{DF}$ of the second compound DF by at least about 0.2 eV, e.g. at least about 0.3 eV, preferably at least about 0.5 eV.

In addition, it is necessary for the EML 240A to implement high luminous efficiency and color purity as well as to transfer exciton energy efficiently from the second compound DF, which is converted to ICT complex state by RISC mechanism in the EML 240A, to the third compound FD of the fluorescent or phosphorescent material in the EML 240A. To this end, the excited triplet energy level $T_1^{DF}$ of the second compound DF is higher than the excited triplet energy level $T_1^{FD}$ of the third compound FD. Optionally, the excited singlet energy level $S_1^{DF}$ of the second compound DF may be higher than the excited singlet energy level $S_1^{FD}$ of the third compound FD. Each of the first and second compounds H and DF may be the compound described in the above aspect.

In addition, exciton energies should be efficiently transferred from the second compound DF of the delayed fluorescent material to the third compound FD of the fluorescent or phosphorescent material to implement hyper fluorescence. As an example, fluorescent or phosphorescent material having absorption (Abs.) spectrum with large overlapping region with the photoluminescence (PL) spectrum of the second compound DF having the delayed fluorescent property may be used as the third compound FD.

The third compound FD may comprise fluorescent or phosphorescent material emitting green or red light. In one exemplary aspect, the third compound FD of the fluorescent material emitting green may comprise, but is not limited to, a BODIPY core and/or a quinolino-acridine core. As an example, the third compound FD may comprise, but is not limited to, 5,12-dimethylquinolino[2,3-b]acridine-7,14(5H, 12H)-dione, 5,12-diethylquinolino[2,3-b]acridine-7,14(5H, 12H)-dione, 5,12-dibutyl-3,10-difluoroquinolino[2,3-b] acridine-7,14(5H, 12H)-dione, 5,12-dibutyl-3,10-bis(trifluoromethyl)quinolino[2,3-b]acridine-7,14(5H, 12H)-dione, 5,12-dibutyl-2,3,9,10-tetrafluoroquinolino[2,3-b]acridine-7, 14(5H, 12H)-dione and 1,1,7,7-tetramethyl-2,3,6,7-tetrahydro-1H,5H-benzo[i,j]quinolizin-9-yl)ethenyl]-4H-pyran-4-ylidene} propanedinitrile (DCJTB).

Alternatively, the third compound FD of the phosphorescent material emitting green light may comprise, but is not limited to, [Bis(2-phenylpyridine)](pyridyl-2-benzofuro[2, 3-b]pyridine)iridium), fac-Tris(2-phenylpyridine)iridium (II) (fac-Ir(ppy)$_3$), Bis(2-phenylpyridine)(acetylacetonate) iridium(II) (Ir(ppy)$_2$(acac)), Tris[2-(p-tolyl)pyridine]iridium (I) (Ir(mppy)$_3$), Bis(2-(naphthalene-2-yl)pyridine) (acetylacetonate)iridium(I) (Ir(npy)$_2$acac), Tris(2-phenyl-3-methyl-pyridine)iridium (Ir(3mppy)$_3$) and fac-Tris(2-(3-p-xylyl)phenyl)pyridine iridium(I) (TEG).

In addition, the third compound FD of the fluorescent material emitting red light may comprise a perylene core. Alternatively, the third compound FD of the phosphoresent material emitting red light may comprise, but is not limited to, [Bis(2-(4,6-dimethyl)phenylquinoline)](2,2,6,6-tetramethylheptane-3,5-dionate)iridium(II), (Bis[2-(4-n-hexylphenyl)quinoline](acetylacetonate)iridium(I) (Hex-Ir(phq)$_2$ (acac)), Tris[2-(4-n-hexylphenyl)quinoline]iridium(I) (Hex- Ir(phq)$_3$), Tris[2-phenyl-4-methylquinoline]iridium(III) (Ir(Mphq)$_3$), Bis(2-phenylquinoline)(2,2,6,6-tetramethylheptene-3,5-dionate)iridium(I) (Ir(dpm)PQ$_2$), Bis(phenylisoquinoline)(2,2,6,6-tetramethylheptene-3,5-dionate)iridium(I) (Ir(dpm)(piq)$_2$), Bis[(4-n-hexylphenyl)isoquinoline](acetylacetonate)iridium(I) (Hex-Ir(piq)$_2$(acac)), Tris[2-(4-n-hexylphenyl)quinoline]iridium(II) (Hex-Ir(piq)$_3$), Tris(2-(3-methylphenyl)-7-methyl-quinolato)iridium (Ir(dmpq)$_3$), Bis[2-(2-methylphenyl)-7-methyl-quinoline](acetylacetonate)iridium(II) (Ir(dmpq)$_2$(acac)) and Bis[2-(3,5-dimethylphenyl)-4-methyl-quinoline](acetylacetonate)iridium(II) (Ir(mphmq)$_2$(acac)).

In one exemplary aspect, the contents of the first compound H in the EML 240A may be larger than each of the contents of the second compound DF, and the contents of the second compound DF may be larger than the contents of the third compound FD. In this case, the exciton energy can be transferred sufficiently from the second compound DF to the third compound FD. For example, the EML 240A may comprise, but is not limited to, the first compound H between about 55 wt % and about 75 wt %, the second compound DF between about 20 wt % and about 40 wt %, and the third compound FD between about 0.1 wt % and about 5 wt %.

Figure 7:
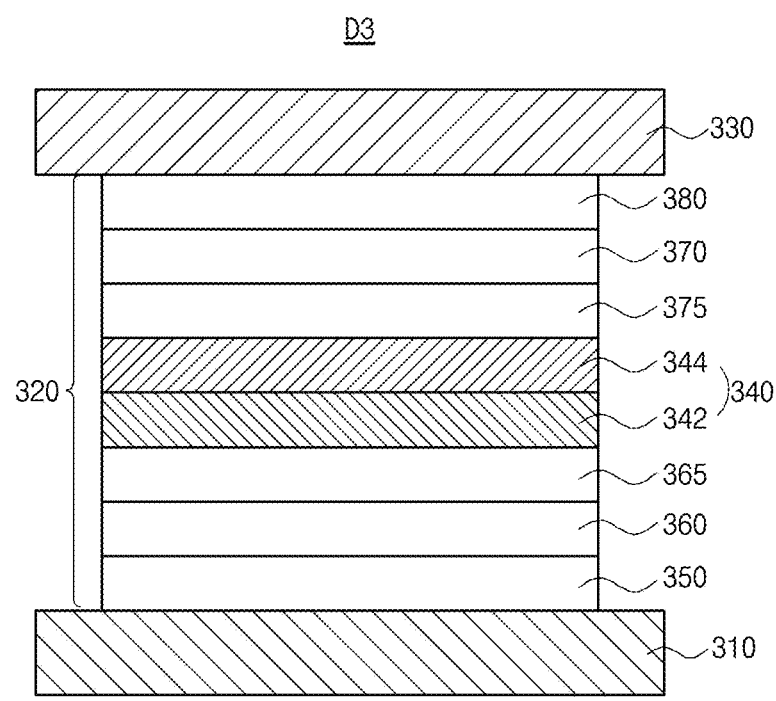
FIG. 7 is a schematic cross-sectional view illustrating an OLED diode in accordance with another exemplary aspect of the present disclosure.
Figure 8:
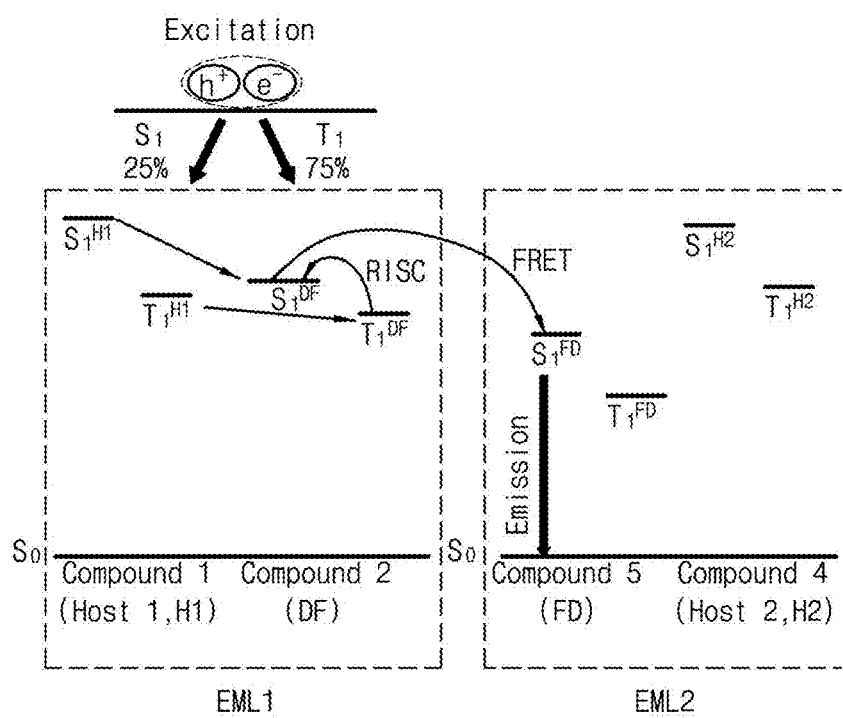
FIG. 8 is a schematic diagram illustrating luminous mechanism by energy level bandgap among luminous materials in accordance with another exemplary aspect of the present disclosure.

The OLEDs in accordance with the previous aspects have a single-layered EML. Alternatively, an OLED in accordance with the present disclosure may include multiple-layered EML. FIG. 7 is a schematic cross-sectional view illustrating an OLED having a double-layered EML in accordance with another exemplary aspect of the present disclosure. FIG. 8 is a schematic diagram illustrating luminous mechanism by energy level bandgap among luminous materials in accordance with another exemplary aspect of the present disclosure.

As illustrated in FIG. 7, the OLED D3 in accordance with this aspect includes first and second electrodes 310 and 330 facing each other and an emissive layer 320 having single emitting unit disposed between the first and second electrodes 310 and 330. In one exemplary aspect, the emissive layer 320 comprises an EML 340. Also, the emissive layer 320 comprises an HIL 350 and an HTL 360 each of which is disposed sequentially between the first electrode 310 and the EML 340, and an ETL 370 and an IL 380 each of which is disposed sequentially between the EML 340 and the second electrode 330. Alternatively, the emissive layer 320 may further comprise an EBL 365 disposed between the HTL 360 and the EML 340 and/or a HBL 375 disposed between the EML 340 and the ETL 370. The configuration of the first and second electrodes 310 and 330 as well as other layers except the EML 340 in the emissive layer 320 may be substantially identical to the corresponding electrodes and layers in the OLEDs D1 and D2.

The EML 340 includes a first EML (EML1) 342 and a second EML (EML2) 344. The EML1 342 is disposed between the EBL 365 and the HBL 375 and the EML2 344 is disposed between the EML1 342 and the HBL 375. One of the EML1 342 and the EML2 344 includes the second compound DF (first dopant) of the delayed fluorescent material, and the other of the EML1 342 and the EML2 344 includes a fifth compound FD (second dopant) of the fluorescent or phosphorescent material. Hereinafter, the EML 340 where the EML1 342 comprises the second compound DF and the EML2 344 comprises the fifth compound FD will be explained.

The EML1 342 comprises the first compound H1 of the first host and the second compound DF of the delayed fluorescent material. The EML2 344 comprises a fourth compound H2 of the second host and a fifth compound FD of the fluorescent or phosphorescent material.

The second compound DF in the EML1 342 comprises any organic compound having the structure of Chemical Formulae 1 to 3 and has the delayed fluorescent property. Accordingly, the triplet exciton energy of the second compound DF in the EML1 342 can be transferred upwardly to its own singlet exciton energy via RISC mechanism. While the second compound DF has high internal quantum efficiency, but it has poor color purity due to its wide FWHM. On the contrary, the fifth compound FD of the fluorescent or phosphorescent material in the EML2 344 has an advantage in terms of color purity due to its narrow FWHM, but its internal quantum efficiency is low because its triplet exciton cannot be involved in the luminescence process.

However, in this exemplary aspect, the singlet exciton energy and the triplet exciton energy of the second compound DF having the delayed fluorescent property in the EML1 342 can be transferred to the fifth compound FD in the EML2 344 disposed adjacently to the EML1 342 by FRET mechanism, and the ultimate light emission occurs in the fifth compound FD within the EML2 344. In other words, the triplet exciton energy of the second compound DF is converted upwardly to its own singlet exciton energy in the EML1 342 by RISC mechanism. Then, the converted singlet exciton energy of the second compound DF is transferred to the singlet exciton energy of the fifth compound FD in the EML2 344.

The fifth compound FD in the EML2 344 can emit light using the triplet exciton energy as well as the singlet exciton energy. As the exciton energy generated at the second compound DF of the delayed fluorescent material in the EML1 342 is transferred efficiently to the fifth compound FD of the fluorescent or phosphorescent material in the EML2 344, the OLED D3 can implement hyper fluorescence. n this case, while the second compound DF having the delayed fluorescent property only acts as transferring exciton energy to the fifth compound FD, substantial light emission is occurred in the EML2 344 including the fifth compound FD of the fluorescent or phosphorescent material. Accordingly, the OLED D3 can improve its quantum efficiency and color purity with narrow FWHM. The fifth compound may be fluorescent or phosphorescent material emitting red or green light. For example, the fifth compound may be the same as the third compound in the second aspect.

Each of the EML 1 342 and the EML2 344 includes the first compound H1 of the first host and the fourth compound H2 of the second host, respectively. The exciton energies generated at the first and fourth compounds H1 and H2 should be transferred primarily to the second compound DF. To this end, each of the excited singlet energy levels $S_1^{H1}$ and $S_1^{H2}$ and excited triplet energy levels $T_1^{H1}$ and $T_1^{H2}$ of the first and fourth compounds H1 and H2 is higher than each of the excited singlet energy level $S_1^{DF}$ and the excited triplet energy level $T_1^{DF}$ of the second compound DF having the delayed fluorescent property, respectively. As an example, each of the excited triplet energy levels $T_1^{H1}$ and $T_1 H^{12}$ of the first and fourth compounds H1 and H2 may be higher than the excited triplet energy level $T_1^{DF}$ of the second compound DF by at least about 0.2 eV, e.g. at least about 0.3 eV, preferably at least about 0.5 eV.

In addition, the excited singlet energy level $S_1^{H2}$ of the fourth compound H2 in the EML2 344 is higher than the excited singlet energy level $S_1^{FD}$ of the fifth compound FD. Alternatively, the excited triplet energy level $T_1^{H2}$ of the fourth compound H2 may be higher than the excited singlet energy level $T_1^{FD}$ of the fifth compound FD. In this case, the singlet exciton energy generated at the fourth compound H2 can be transferred to the singlet energy of the fifth compound FD.

Moreover, exciton energy should be transferred efficiently from the second compound DF that is converted to ICT complex state by RISC in the EML1 342 to the fifth compound FD of the fluorescent or phosphorescent material in the EML2 344. To this end, the excited singlet energy level $S_1^{DF}$ of the second compound DF in the EML1 342 is higher than the excited singlet energy level $S_1^{FD}$ of the fifth compound FD in the EML2 344. Alternatively, the excited triplet energy level $T_1^{DF}$ of the second compound DF in the EML1 342 is higher than the excited triplet energy level $T_1^{FD}$ of the fifth compound FD in the EML2 344.

Also, the energy level bandgap ($|HOMO^H-HOMO^{DF}|$) between the HOMO energy level ($HOMO^H$) of the first and/or fourth compounds H1 and H2 and the HOMO energy level ($HOMO^{DF}$) of the second compound DF, or the energy level bandgap ($|LUMO^H-LUMO^{DF}|$) between a LUMO energy level ($LUMO^H$) of the first and/or fourth compounds H1 and H2 and the LUMO energy level ($LUMO^{DF}$) of the second compound DF may be equal to or less than about 0.5 eV. When the luminous materials do not satisfy the requirements above, excitons may be quenched as non-radiation at each of the second compound DF or excitons cannot be transferred to the dopants from the hosts, and results in luminous efficiency reduction in the OLED D3.

The first and fourth compounds H1 and H2 may be the same or different from each other. In one exemplary aspect, each of the first and fourth compounds H1 and H2 may be the same as the first compound H in the above aspects. The second compound DF of the delayed fluorescent material may be any organic compound having the structure of Chemical Formulae 1 to 3. The fifth compound FD may be the same as the third compound FD described in the second aspect.

In one exemplary aspect, each of the contents of the first and fourth compounds H1 and H2 in the EML1 342 and the EML2 344 may be larger than or equal to the contents of the second and fifth compounds DF and FD in the same layer. Also, the contents of the second compound DF in the EML1 342 may be larger than the contents of the fifth compound FD in the EML2 344. In this case, exciton energy can be transferred sufficiently from the second compound DF to the fifth compound FD via FRET mechanism. As an example, the contents of the second compound DF in the EML1 342 may be, but is not limited to, between about 1 wt % and about 50 wt %, preferably between about 10 wt % and about 50 wt %, and more preferably between about 20 wt % and about 40 wt %. On the contrary, the EML2 344 may comprise the fourth compound H2 between about 90 wt % and about 99 wt %, preferably between about 95 wt % and about 99 wt %, and the fifth compound FD between about 1 wt % and about 10 wt %, preferably between about 1 wt % and about 5 wt %.

In another exemplary aspect, when the EML2 344 is disposed adjacently to the HBL 375, the fourth compound H2, which is included in the EML2 344 together with the fifth compound FD, may be the same material as the HBL 375. In this case, the EML2 344 may have s hole blocking function as well as an emission function. In other words, the EML2 344 can act as a buffer layer for blocking holes. In one aspect, the HBL 375 may be omitted where the EML2 344 may be a hole blocking layer as well as an emitting material layer.

In another aspect, when the EML2 344 is disposed adjacently to the EBL 365, the forth compound H2 in the EML2 344 may be the same as the EBL 365. In this case, the EML2 344 may have an electron blocking function as well as an emission function. In other words, the EML2 344 can act as a buffer layer for blocking electrons. In one aspect, EBL 365 may be omitted where the EML2 344 may be an electron blocking layer as well as an emitting material layer.

Figure 9:
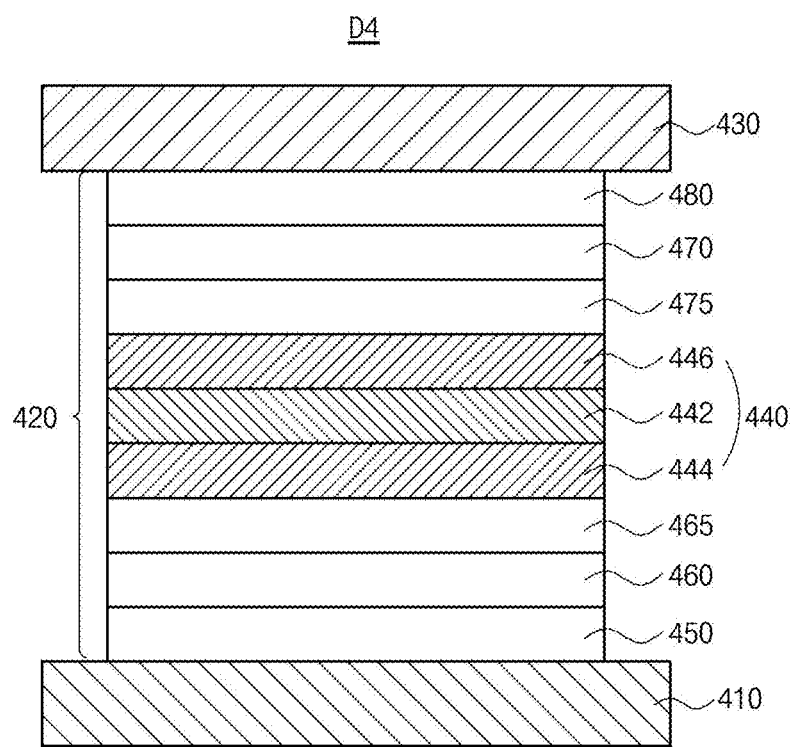
FIG. 9 is a schematic cross-sectional view illustrating an OLED in accordance with another exemplary aspect of the present disclosure.
Figure 10:
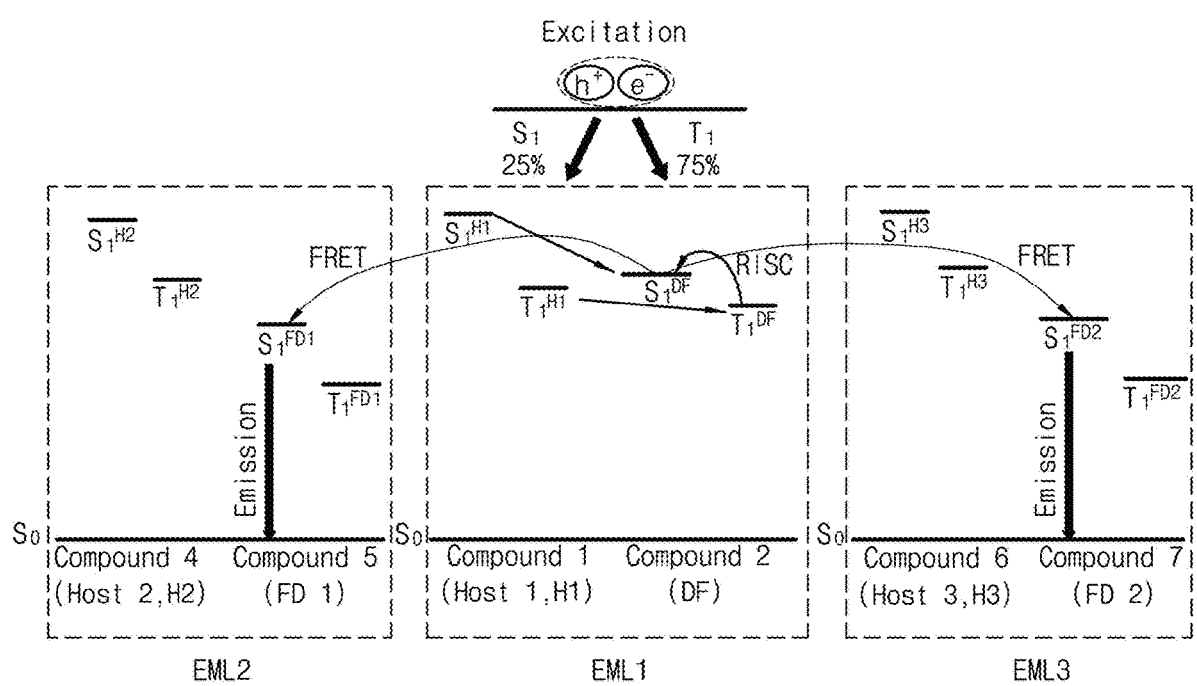
FIG. 10 is a schematic diagram illustrating luminous mechanism by energy level bandgap among luminous materials in accordance with another exemplary aspect of the present disclosure.

An OLED having a triple-layered EML will be explained. FIG. 9 is a schematic cross-sectional view illustrating an OLED having a triple-layered EML in accordance with another exemplary aspect of the present disclosure. FIG. 10 is a schematic diagram illustrating luminous mechanism by energy level bandgap among luminous materials in accordance with another exemplary aspect of the present disclosure.

As illustrated in FIG. 9, the OLED D4 in this aspect comprises first and second electrodes 410 and 430 facing each other and an emissive layer 420 having a single emitting unit disposed between the first and second electrodes 410 and 430.

In one exemplary aspect, the emissive layer 420 having single emitting unit comprises a three-layered EML 440. The emissive layer 420 comprises an HIL 450 and an HTL 460 each of which is disposed sequentially between the first electrode 410 and the EML 440, and an ETL 470 and an EIL 480 each of which is disposed sequentially between the EML 440 and the second electrode 430. Alternatively, the emissive layer 420 may further comprise an EBL 465 disposed between the HTL 460 and the EML 440 and/or a HBL 475 disposed between the EML 440 and the ETL 470. The configurations of the first and second electrodes 410 and 430 as well as other layers except the EML 440 in the emissive layer 420 may be substantially identical to the corresponding electrodes and layers in the OLEDs D1, D2 and D3.

The EML 440 comprises a first EML (EML1) 442, a second EML (EML2) 444 and a third EMI, (EML3) 446. The EML 442 is disposed between the EBL 465 and the HBL 475, the EML2 444 is disposed between the EBL 465 and the EML1 442 and the EML3 446 is disposed between the EML 1 442 and the HBL 475.

The EML1 442 comprises the second compound DF of the delayed fluorescent material (first dopant), and each of the EML2 444 and the EML3 446 comprises the fifth compound FD1 (second dopant) and a seventh compound FD2 (third dopant) each of may be the fluorescent or phosphorescent material, respectively. In addition, each of the EML1 442, EML2 444 and EML3 446 further includes the first, fourth and sixth compounds H1, H2 and H3 each of which may be the first to third hosts, respectively.

In accordance with this aspect, the singlet energy as well as the triplet energy of the second compound DF, i.e. the delayed fluorescent material in the EML1 442 can be transferred to the fifth and seventh compounds FD1 and FD2, i.e. the fluorescent or phosphorescent material each of which is included in the EML2 4424 and EML3 446 disposed adjacently to the EML1 442 by FRET mechanism. Accordingly, the ultimate emission occurs in the fifth and seventh compounds FD1 and FD2 in the EML2 444 and the EML3 446.

In other words, the triplet exciton energy of the second compound DF having the delayed fluorescent property in the EML1 442 is converted upwardly to its own singlet exciton energy by RISC mechanism, then the singlet exciton energy of the second compound DF is transferred to the singlet exciton energy of the fifth and seventh compounds FD1 and FD2 in the EML2 444 and the EML3 446 because the second compound DF has the excited singlet energy level $S_1^{DF}$ higher than each of the excited singlet energy levels $S_1^{FD1}$ and $S_1^{FD2}$ of the fifth and seventh compounds FD1 and FD2 (see, FIG. 10).

Since the fifth and seventh compounds FD1 and FD2 in the EML2 444 and EML3 446 can emit light using the singlet exciton energy and the triplet exciton energy derived from the second compound DF, the OLED D4 can improve its luminous efficiency. In addition, since each of the fifth and seventh compounds FD1 and FD2 has relatively narrow FWHM compared to the second compound DF, the OLED D4 can enhance its color purity. Particularly, in case of using the fifth and seventh compounds FD1 and FD2 having Abs. spectrum with large overlapping area with the PL spectrum of the second compound DF, exciton energy can be transferred efficiently from the second compound DF to the fifth and seventh compounds FD1 and FD2. In this case, while the second compound DF only acts as transferring exciton energy to the fifth and seventh compounds FD1 and FD2, substantial light emission is occurred in the EML2 444 and the EML3 446 including the fifth and seventh compounds FD1 and FD2.

In addition, it is necessary to adjust luminous materials introduced into the EML1 442, the EML2 444 and the EML3 446 so as to implement efficient luminescence. With referring to FIG. 10, each of the excited singlet energy levels $S_1^{H1}$, $S_1^{H1}$ and $S_1^{H3}$ and the excited triplet energy levels $T_1^{H1}$, $T_1^{H2}$ and $T_1^{H3}$ of the first, fourth and sixth compounds H1, H2 and H3, each of which is the first to third hosts, respectively, is higher than each of the excited singlet energy level $S_1^{DF}$ and the excited triplet energy level $T_1^{DF}$ of the second compound DF, respectively.

Also, exciton energy should be transferred efficiently from the second compound DF that is converted to ICT complex state by RISC in the EML1 442 to the fifth and seventh compounds FD1 and FD2 each of which is the fluorescent or phosphorescent material in the EML2 444 and in the EML3 446. To this end, the excited singlet energy level SIDE of the second compound DF in the EML1 442 is higher than each of the excited singlet energy levels $S_1^{FD1}$ and $S_1^{FD2}$ of the fifth and seventh compounds FD1 and FD2 in the EML2 444 and the EML3 446. Alternatively, the excited triplet energy level $T_1^{DF}$ of the second compound DF in the EML1 442 is higher than each of the excited triplet energy levels $T_1^{FD1}$ and $T_1^{FD2}$ of the fifth and seventh compounds FD1 and FD2 in the EML2 444 and the EML3 446.

In addition, the exciton energy transferred from the second compound DF of the delayed fluorescent material to the fifth and seventh compounds FD1 and FD2 of the fluorescent or phosphorescent material should not transferred to the fourth and sixth compounds H2 and H3 in order to realize efficient luminescence. To this end, each of the excited singlet energy levels $S_1^{H2}$ and $S_1^{H3}$ of the fourth and sixth compounds H2 and H3, each of which is the second and third hosts, respectively, is higher than each of the excited singlet energy levels $S_1^{FD1}$ and $S_1^{FD2}$ of the fifth and seventh compounds FD1 and FD2, each of which is the fluorescent or phosphorescent material. Alternatively, each of the excited triplet energy levels $T_1^{H2}$ and $T_1^{H3}$ of the fourth and sixth compounds H2 and H3 may be higher than each of the excited triplet energy levels $T_1^{FD1}$ and $T_1^{FD2}$ of the fifth and seventh compounds FD1 and FD2.

As described above, each of the EML1 442, the EML2 444 and the EML3 446 comprises the first, fourth and sixth compounds H1, H2 and H3 each of which is the first to third hosts, respectively. The first, fourth and sixth compounds H1, H2 and H3 may be the same or different from each other. In one exemplary aspect, each of the first and fourth compounds H1 and H2 may be the same as the first compound H in the above aspects. The second compound DF of the delayed fluorescent material may be any organic compound having the structure of Chemical Formulae 1 to 3. Each of the fifth and seventh compounds FD1 and FD2 may be the same as the third compound described in the second aspect.

In one exemplary aspect, the contents of the second compound DF in the EML1 442 may be larger than the contents of each of the fifth and seventh compounds FD1 and FD2 in the EML2 444 and in the EML3 446. In this case, exciton energy can be transferred sufficiently from the second compound DF to the fifth and seventh compounds FD1 and FD2 via FRET mechanism. As an example, the contents of the second compound DF in the EML1 442 may be, but is not limited to, about 1 wt % to about 50 wt %, preferably about 10 wt % to about 50 wt %, and more preferably about 20 wt % to about 40 wt %. On the contrary, each of the EML2 444 and the EML3 446 may comprise the fourth or sixth compound H2 or H3 between about 90 wt % and about 99 wt %, preferably between about 95 wt % and about 99 wt %, and the fifth or seventh compound FD1 or FD2 between about 1 wt % and about 10 wt %, preferably between about 1 wt % and about 5 wt %.

In one exemplary aspect, when the EML2 444 is disposed adjacently to the EBL 465, the fourth compound H2 in the EML2 444 may be the same material as the EBL 465. In this case, the EML2 444 may have an electron blocking function as well as an emission function. In other words, the EML2 444 can act as a buffer layer for blocking electrons. In one aspect, the EBL 465 may be omitted where the EML2 444 may be an electron blocking layer as well as an emitting material layer.

When the EML3 466 is disposed adjacently to the HBL 475, the sixth compound H3 in the EML3 446 may be the same material as the HBL 475. In this case, the EML3 446 may have a hole blocking function as well as an emission function. In other words, the EML3 446 can act as a buffer layer for blocking holes. In one aspect, the HBL 475 may be omitted where the EML3 446 may be a hole blocking layer as well as an emitting material layer.

In still another exemplary aspect, the fourth compound H2 in the EML2 444 may be the same material as the EBL 455 and the sixth compound H3 in the EML3 446 may be the same material as the HBL 475. In this aspect, the EML2 444 may have an electron blocking function as well as an emission function, and the EML3 446 may have a hole blocking function as well as an emission function. In other words, each of the EML2 444 and the EML3 446 can act as a buffer layer for blocking electrons or hole, respectively. In one aspect, the EBL 465 and the HBL 475 may be omitted where the EML2 444 may be an electron blocking layer as well as an emitting material layer and the EML3 446 may be a hole blocking layer as well as an emitting material layer.

Synthesis Example 1: Synthesis of Compound 1-4

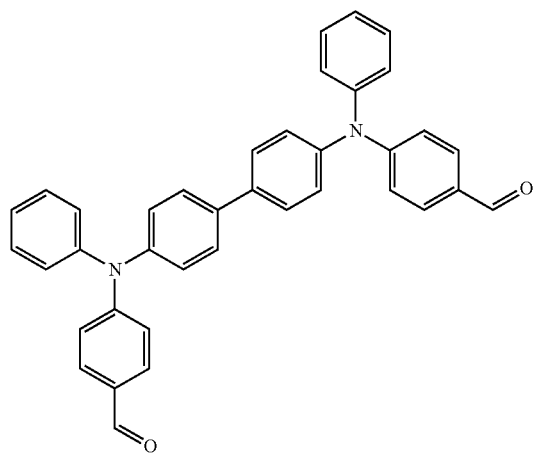

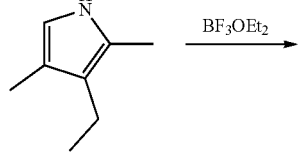

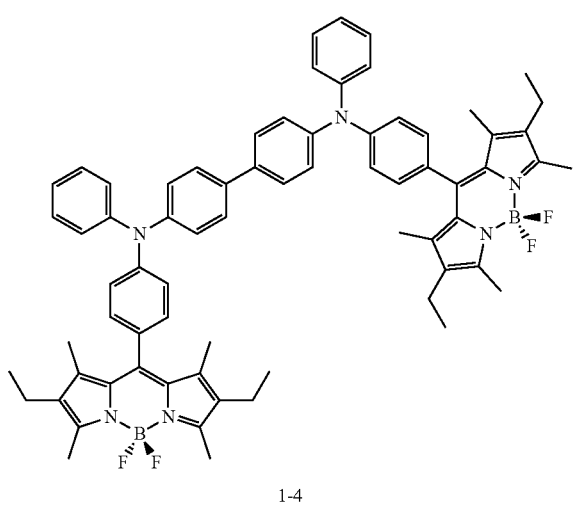

1-4

4,4'-([1,1'-biphenyl]-4,4'-diylbis(phenylazanediyl)dibenzaldehyde (1.00 g, 1 equivalent), 3-ethyl-2,4-dimethyl-1H-pyrrole (0.68 g, 3 equivalents) were dissolved in dichloromethane, and the solution was stirred. Trifluoroacetic acid was added into the solution, and then the solution was stirred overnight at room temperature. p-chloroaniline (0.50 g, 1.1 equivalents) were added into the solution, and the solution was stirred for 30 minutes or more. Triethylamine (1.54 mL, 6 equivalents) were added slowly into the solution, and the solution was stirred for 30 minutes or more at room temperature. Boron trifluoride diethyl etherate (BF$_3$OEt$_2$, 2.04 mL, 9 equivalents) were added into the solution, and then the mixture was reacted for 4 hours or more at room temperature. After the reaction was complete, the solution was extracted with dichloromethane and DI water three times, and the moisture was removed using Na$_2$SO$_4$. The extracted organic layer was filtered with lamination using both celite and silica gel, and the obtained crude product was purified with column chromatography using hexane:methylene chloride (MC), hexane:ethyl acetate (EA) and hexane:toluene as an eluent in each purification step. The purified product was re-crystallized to give a red solid, compound 1-4.

Synthesis Example 2: Synthesis of Compound 1-8

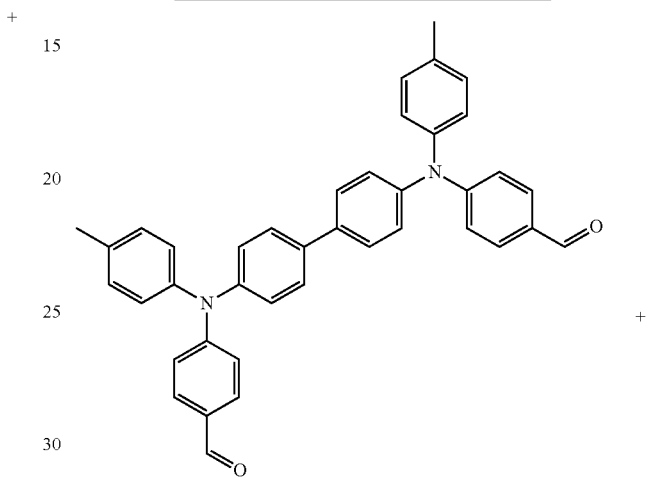

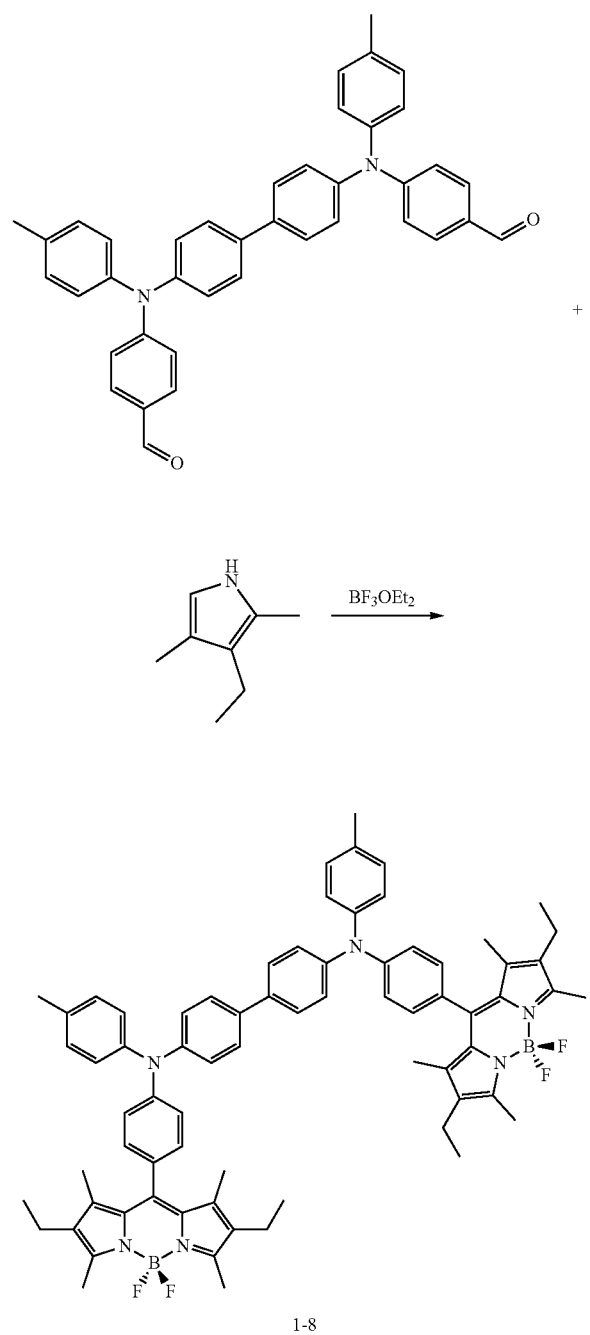

1-8

4,4'-([1,1'-biphenyl]-4,4'-diylbis(tolylazanediyl))dibenzaldehyde (1.00 g, 1 equivalent), 3-ethyl-2,4-dimethyl-1H- pyrrole (0.65 g, 3 equivalents) were dissolved in dichloromethane under nitrogen atmosphere, and the solution was stirred. Trifluoroacetic acid was added into the solution, and then the solution was stirred overnight at room temperature. p-chloroaniline (0.47 g, 1.1 equivalents) were added into the solution, and the solution was stirred for 30 minutes or more. Triethylamine (1.46 mL, 6 equivalents) were added slowly into the solution, and the solution was stirred for 30 minutes or more at room temperature. Boron trifluoride diethyl etherate (BF$_3$OEt$_2$, 1.94 mL, 9 equivalents) were added into the solution, and then the mixture was reacted for 4 hours or more at room temperature. After the reaction was complete, the solution was extracted with dichloromethane and DI water three times, and the moisture was removed using Na$_2$SO$_4$. The extracted organic layer was filtered with lamination using both celite and silica gel, and the obtained crude product was purified with column chromatography using hexane:methylene chloride (MC), hexane:ethyl acetate (EA) and hexane:toluene as an eluent in each purification step. The purified product was re-crystallized to give a orange solid, compound 1-8.

Synthesis Example 3: Synthesis of Compound 1-11

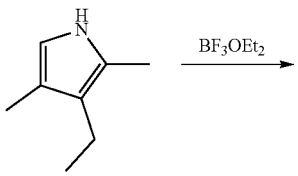

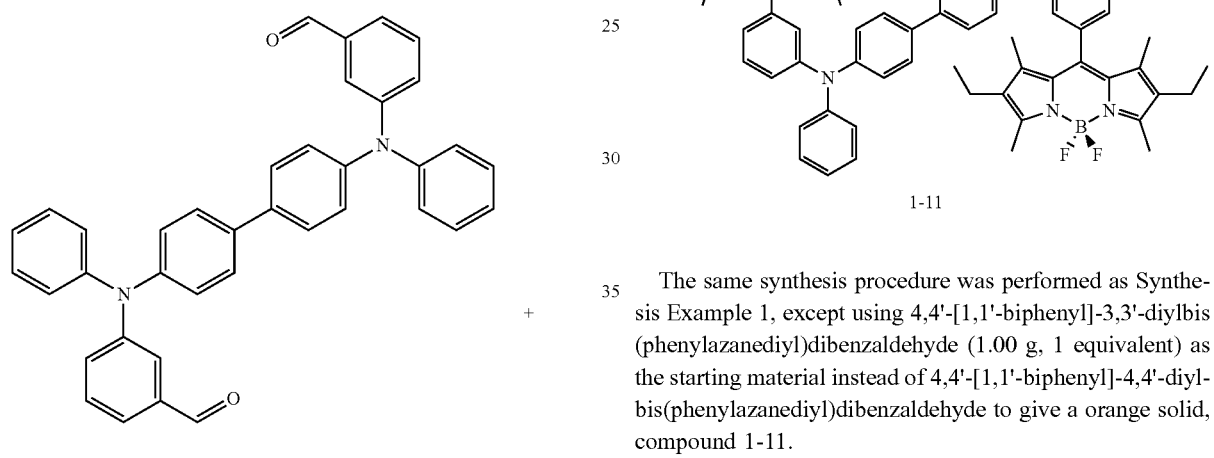

1-11

The same synthesis procedure was performed as Synthesis Example 1, except using 4,4'-[1,1'-biphenyl]-3,3'-diylbis(phenylazanediyl)dibenzaldehyde (1.00 g, 1 equivalent) as the starting material instead of 4,4'-[1,1'-biphenyl]-4,4'-diylbis(phenylazanediyl)dibenzaldehyde to give a orange solid, compound 1-11.

Synthesis Example 4: Synthesis of Compound 2-1

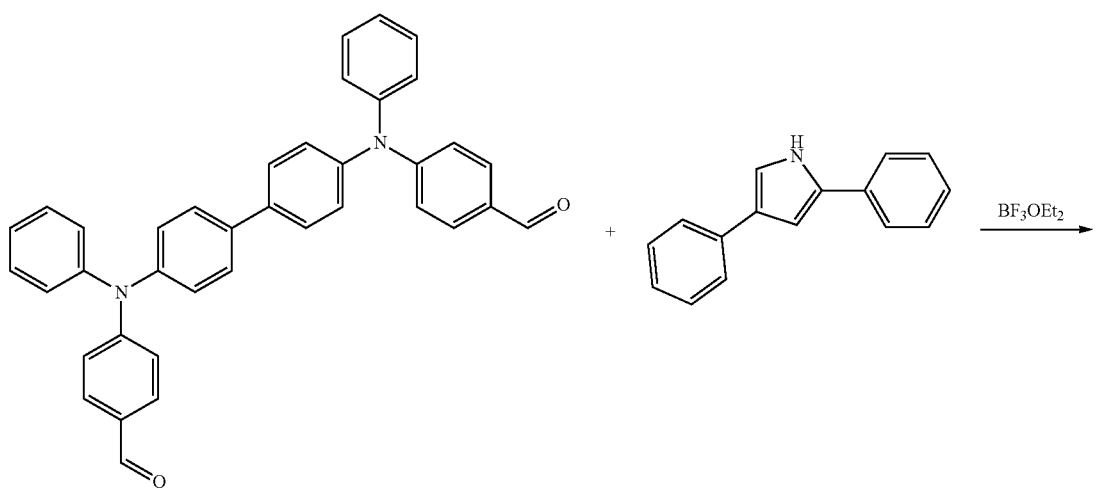

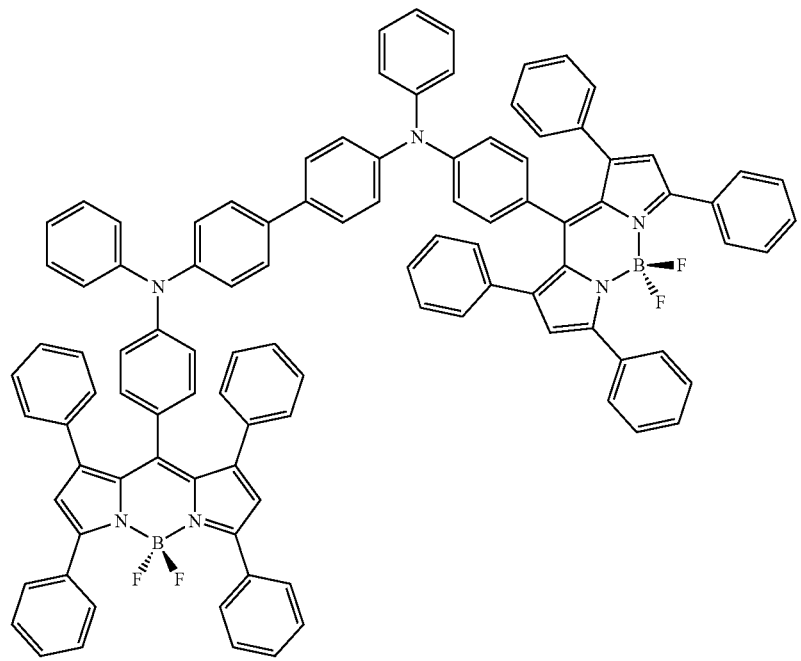

2-1

The same synthesis procedure was performed as Synthesis Example 1, except using 2,4-diphenyl-1H-pyrrole as the starting material instead of 3-ethyl-2,4-dimethyl-1H-pyrrole to give a red solid, compound 2-1.

Experimental Example 1: Measurement of Energy Levels

After each of compounds 1-4, 1-8 and 1-11 synthesized in the Synthesis Examples 1-3 were dissolved in toluene in a concentration of 10-5 M, Physical properties such as photoluminescence wavelength (PL λ) and photoluminescence quantum yield (PLQY) of the compounds were measured. For comparison, the PL λ and PLQY of the Ref. 1 compound and the Ref. 2 compound indicated below were also measured using the same procedure. Table 1 below indicated the measurement results.

Reference Compound

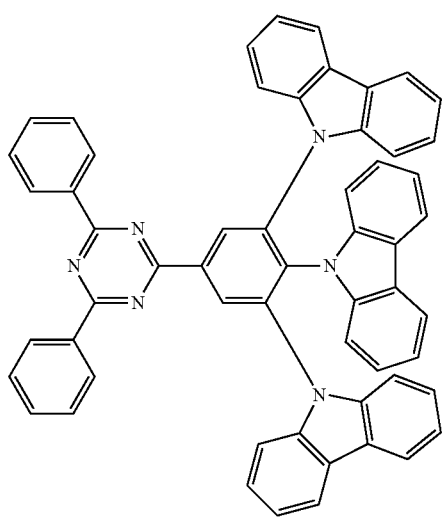

Ref. 1

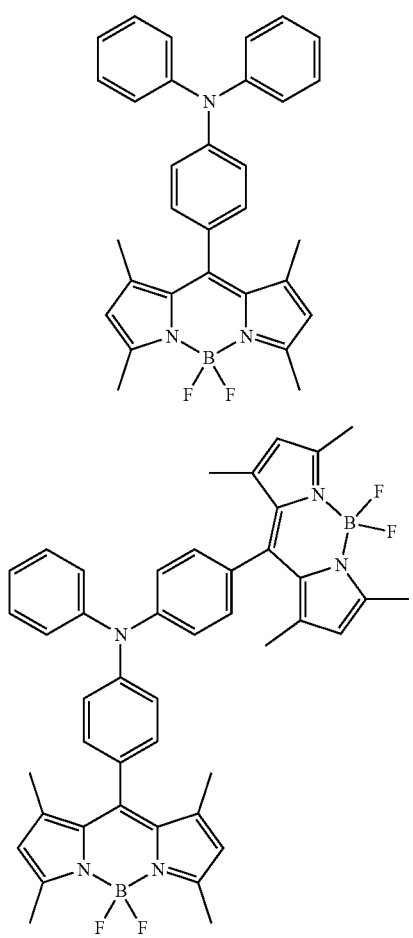

Ref. 2

Ref. 3

TABLE 1

| Physical Property of Organic Compound | | |
|---|---|---|
| Compound | PL λ (nm) | PLQY (%) |
| 1-4 | 540 | 94 |
| 1-8 | 542 | 90 |
| 1-11 | 540 | 80 |
| Ref. 1 | 526 | 57 |
| Ref. 2 | 516 | 74 |

As illustrated in Table 1, the organic compound synthesized in the Synthesis Examples showed PL peak of green wavelength ranges and had improved PLQY compared to the Ref. 1 and Ref. 2 compounds.

Example 1 (Ex. 1): Fabrication of OLED

An OLED in which the Compound 1-4 was applied into a dopant of an EML was fabricated. An ITO (50 nm) attached glass substrate was washed ozone and was loaded into the vapor system, and then was transferred to a vacuum deposition chamber in order to deposit other layers on the substrate. An organic layer was deposited by evaporation by a heated boat under $10^{-7}$ torr with setting a deposition rate to 1 Å/s in the following order.

An ITO (50 nm); a HIL (HAT-CN; 5 nm); a HTL (NPB, 50 nm); an EBL (mCBP, 10 nm); an EML (4-(3-(2-triphenylene-2-yl)phenyl)-dibenzothiophene (host): compound 1-4 (dopant)=70:30 by weight, 30 nm); a HBL (B3PYMPM, 10 nm); an ETL (TPBi; 30 nm); an EIL (LiF; 1.0 nm); and a cathode (Al; 100 nm).

And then, capping layer (CPL) was deposited over the cathode and the device was encapsulated by glass. After deposition of emissive layer and the cathode, the OLED was transferred from the deposition chamber to a dry box for film formation, followed by encapsulation using UV-curable epoxy resin and moisture getter.

Examples 2-3 (Ex. 2-3): Fabrication of OLED

An OLED was fabricated using the same materials as Example 1, except that Compound 1-8 (Ex. 2) or Compound 1-11 (Ex. 3) was applied into the EML as the dopant instead of the Compound 1-4.

Comparative Example 1-3 (Com. 1-3): Fabrication of OLED

An OLED was fabricated using the same materials as Example 1, except that Ref. 1 compound (Com. 1), Ref. 2 compound (Com. 2) or Ref. 3 compound (Com. 3) was applied into the EML as the dopant instead of the Compound 1-4.

Experimental Example 2: Measurement of Luminous Properties of OLED

Each of the OLED having luminous area of 9 mm$^2$ and fabricated by Ex. 1-3 and Ref. 1-3 was connected to an external power source and then luminous properties for all the diodes were evaluated using a constant current source (KEITHLEY) and a photometer PR650 at room temperature. In particular, driving voltage (V), maximum electroluminescence wavelength ($EL_{max}$, nm), FWHM (nm), External Quantum Efficiency (EQE, %) and CIE color coordinates at a current density of 6.3 mA/cm$^2$ were measured. The results thereof are shown in the following Table 2.

TABLE 2

| Luminous Properties of OLED | | | | | | |
|---|---|---|---|---|---|---|
| Sample | Dopant | V | $EL_{max}$ (nm) | FWHM (nm) | EQE (%) | CIE (x, y) |
| Ref .1 | Ref. 1 | 4.27 | 538 | 105.0 | 6.75 | (0.406, 0.555) |
| Ref. 2 | Ref. 2 | 4.68 | 544 | 90.6 | 9.23 | (0.388, 0.578) |
| Ref. 3 | Ref. 3 | 4.61 | 539 | 85.0 | 6.21 | (0.360, 0.567) |
| Ex. 1 | 1-4 | 4.82 | 544 | 78.3 | 12.75 | (0.393, 0.575) |
| Ex. 2 | 1-8 | 4.50 | 544 | 77.8 | 12.06 | (0.391, 0.577) |
| Ex. 3 | 1-11 | 4.43 | 543 | 80.8 | 10.10 | (0.370, 0.579) |

As indicated in Table 2, compared to the OLED in Ref. 1 in which conventional triazine-based delayed fluorescent material is applied into the EML, the OLEDs in Ex. 1-3 reduced their FWHMs up to 25.9% (up to 27.2 nm) and enhanced their EQEs up to 88.9%. Compared to the OLED in Ref. 2 in which the compound including BODIPY core linked to aryl amino group is applied into the EML, the OLEDs in Ex. 1-3 showed substantially equivalent or slightly reduced driving voltages, reduced their FWHMs up to 14.1% (up to 12.8 nm) and enhanced their EQEs up to 38.1%. In addition, compared to the OLED in Ref. 3 in which the organic compound having two BODIPY moieties interconnected by phenyl amino group is applied in the EML, the OLEDs in Ex. 1-3 showed substantially equivalent or slightly reduced driving voltage, reduced their FWHMs up to 8.5% (up to 7.2 nm) and enhanced their EQEs up to 105.3%.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An organic compound having the following structure of Chemical Formula 1:

[Chemical Formula 1]

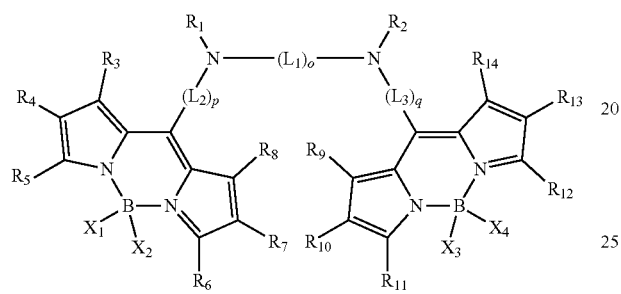

wherein each of $R_1$ and $R_2$ is independently selected from the group consisting of an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_{14}$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or two adjacent groups among $R_3$ to $R_{14}$ form an unsubstituted or substituted $C_6$-$C_{20}$ aromatic ring or an unsubstituted or substituted $C_3$-$C_{20}$ hetero aromatic ring; each of $X_1$ to $X_4$ is independently halogen; each of $L_1$ to $L_3$ is independently an unsubstituted or substituted $C_6$-$C_{30}$ arylene group or an unsubstituted or substituted $C_3$-$C_{30}$ hetero arylene group; o is an integer of 1 or 2; and each of p and q is an integer between 0 (zero) to 2.

2. The organic compound of claim 1, wherein each of at least four groups among $R_3$ to $R_8$ and at least four groups among $R_9$ to $R_{14}$ is independently an unsubstituted or substituted $C_1$-$C_{10}$ alkyl group, each of $L_1$ to $L_3$ is independently an unsubstituted or substituted $C_6$-$C_{30}$ arylene group, and each of p and q is independently an integer of 1 or 2.

3. The organic compound of claim 1, wherein each of at least two groups among $R_3$, $R_5$, $R_7$ and $R_8$ and at least two groups among $R_9$, $R_{11}$, $R_{12}$ and $R_{14}$ is independently an unsubstituted or substituted $C_6$-$C_{20}$ aryl group or an unsubstituted or substituted $C_3$-$C_{20}$ hetero aryl group, each of $L_1$ to $L_3$ is independently an unsubstituted or substituted $C_6$-$C_{30}$ arylene group, and each of p and q is independently an integer of 1 or 2.

4. The organic compound of claim 1, wherein the organic compound comprises any one having the following structure of Chemical Formula 2:

[Chemical Formula 2]

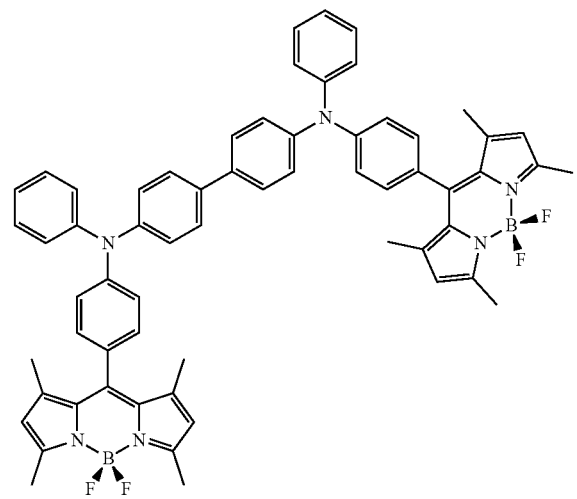

1-1

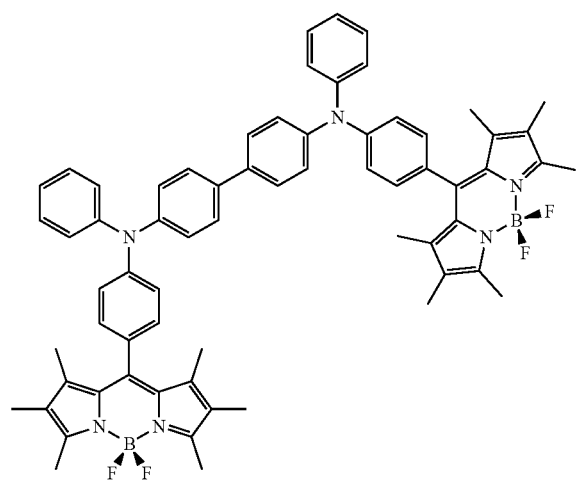

1-2

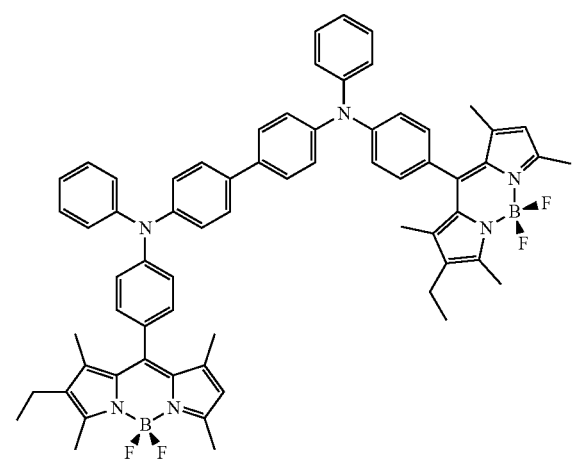

1-3

1-4
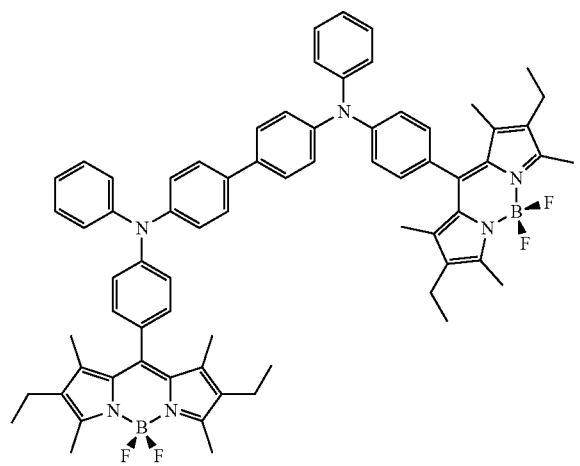
1-7
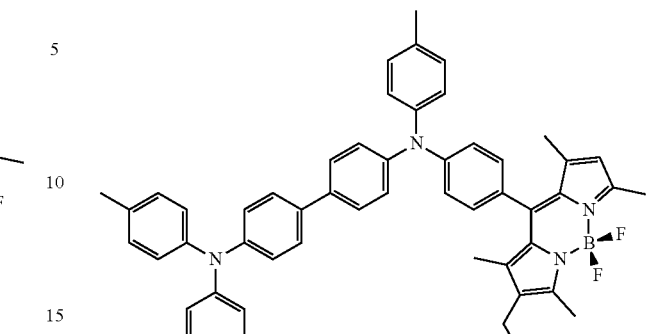
1-5
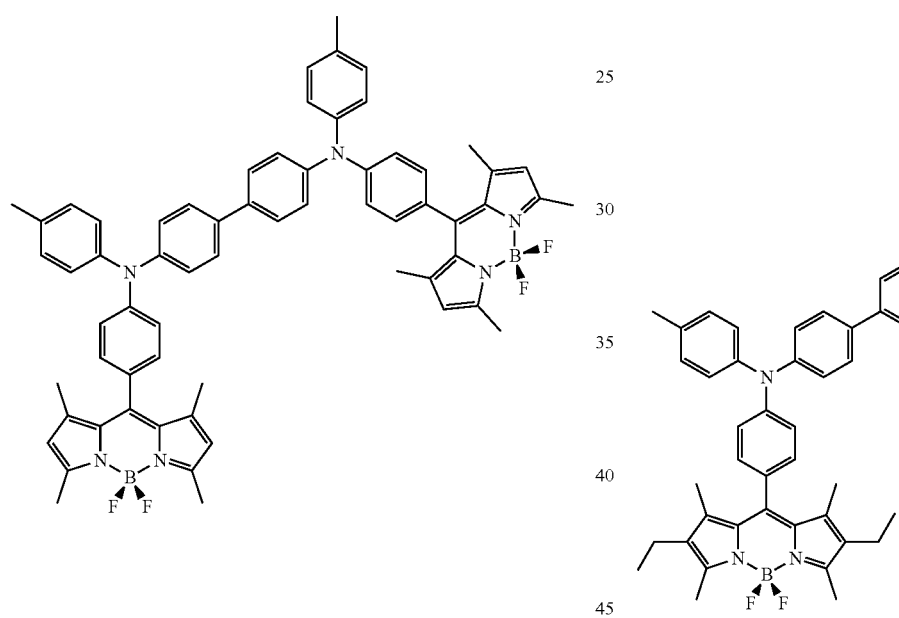
1-8
1-6
1-9
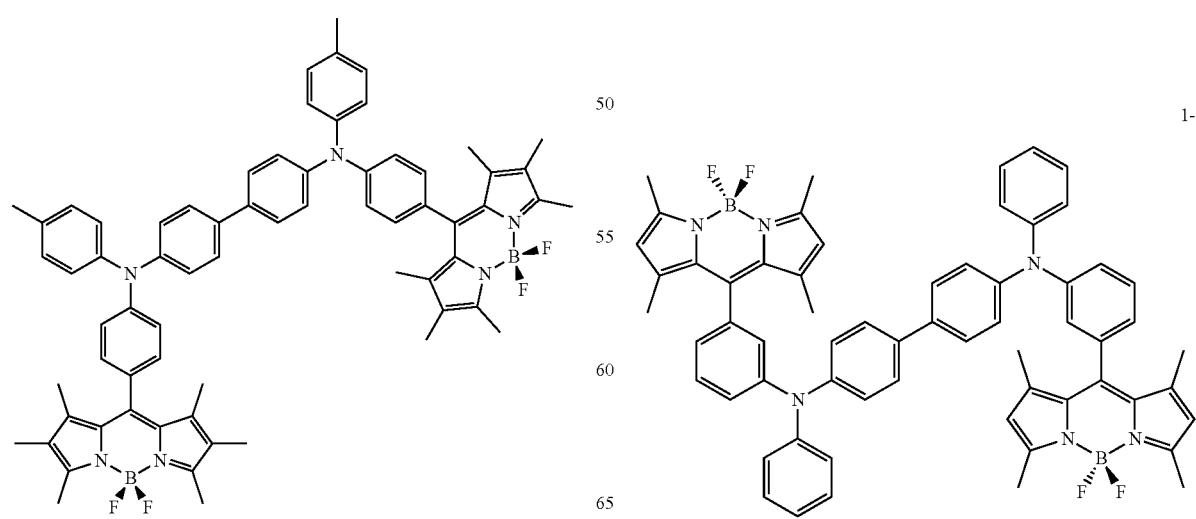

1-10
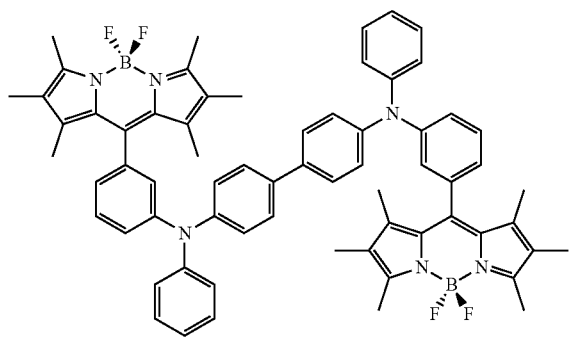
1-11
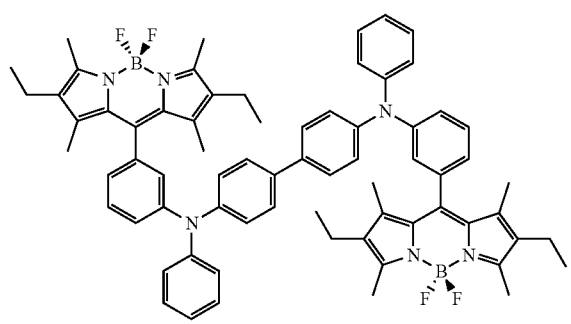
1-12
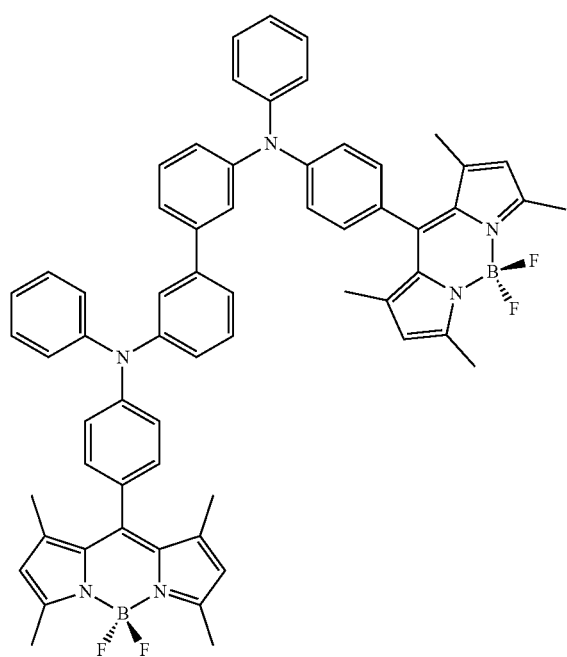
1-14
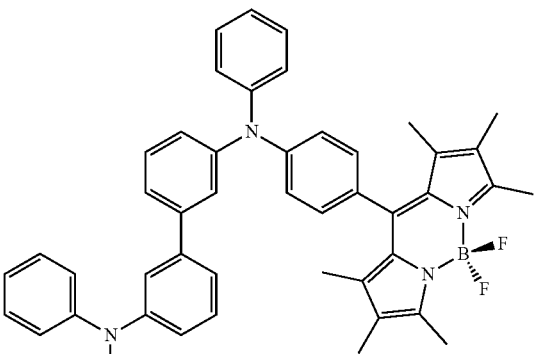
1-15
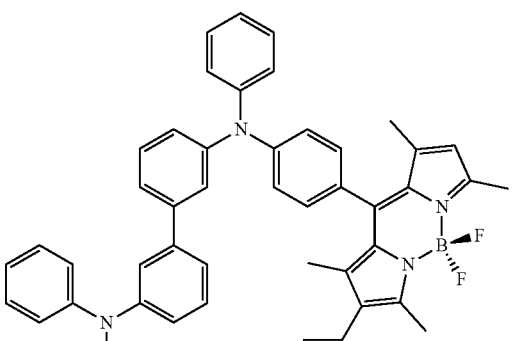

-continued
1-16
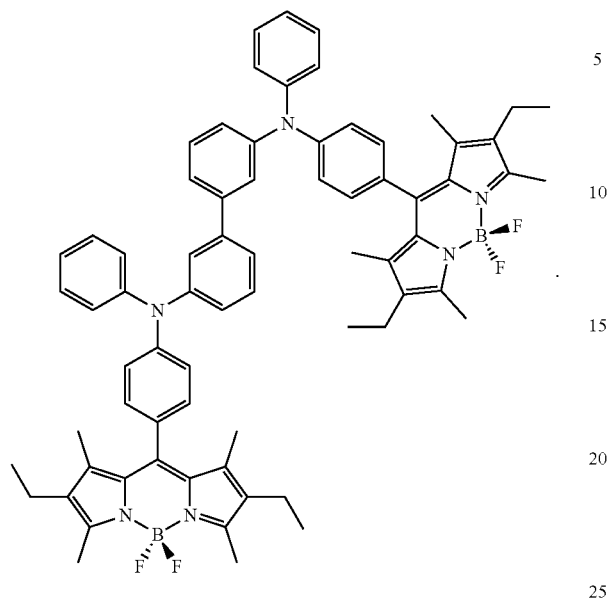
5. The organic compound of claim 1, wherein the organic compound comprises any one having the following structure of Chemical Formula 3:
[Chemical Formula 3]
2-1
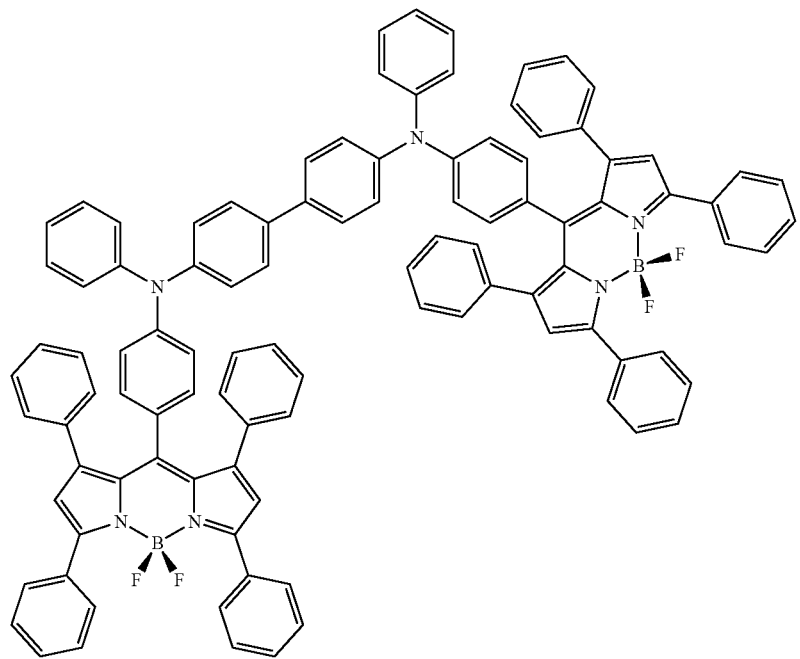

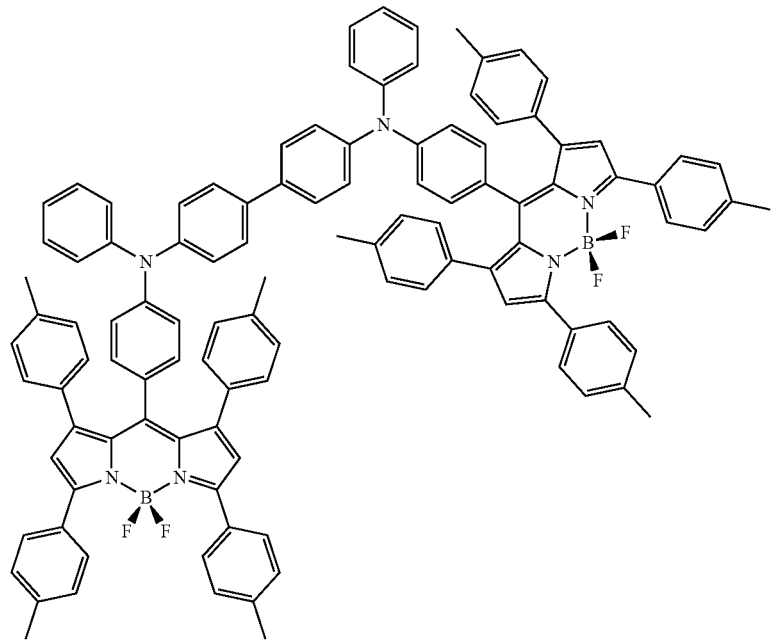
2-2
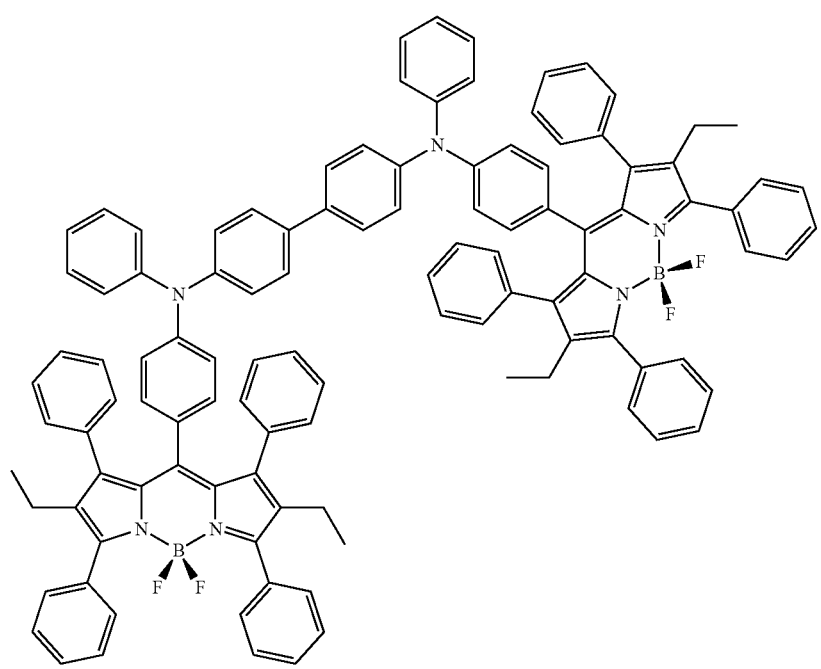
2-3

2-4
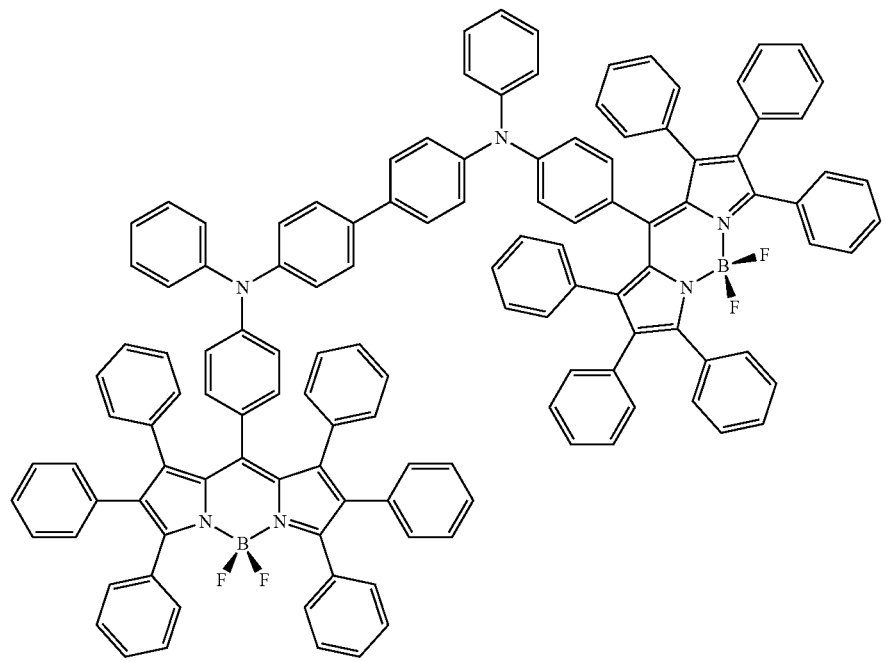
2-5
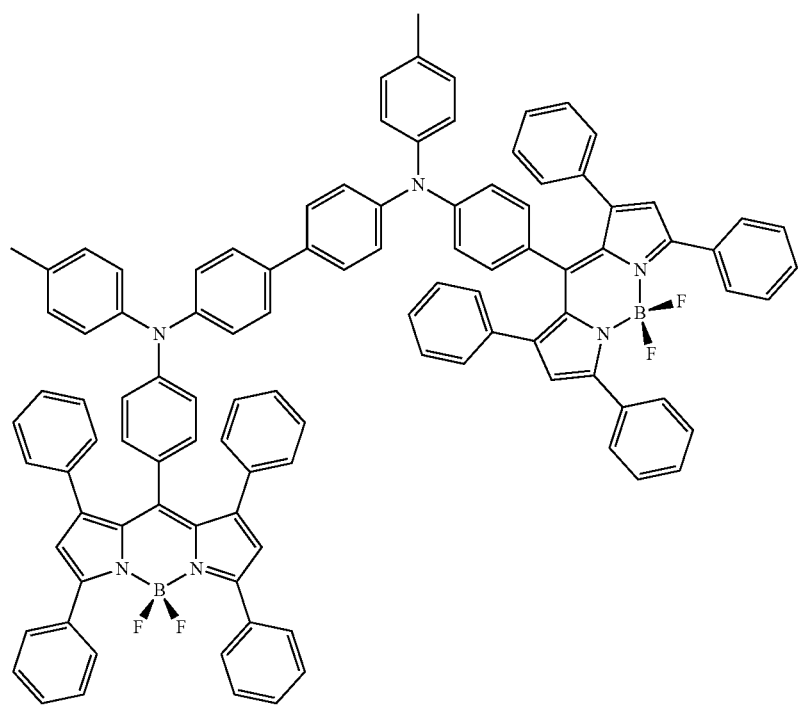

-continued
2-6
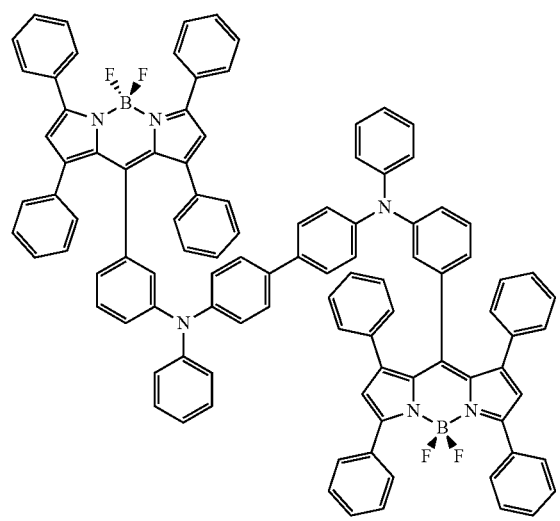
2-7
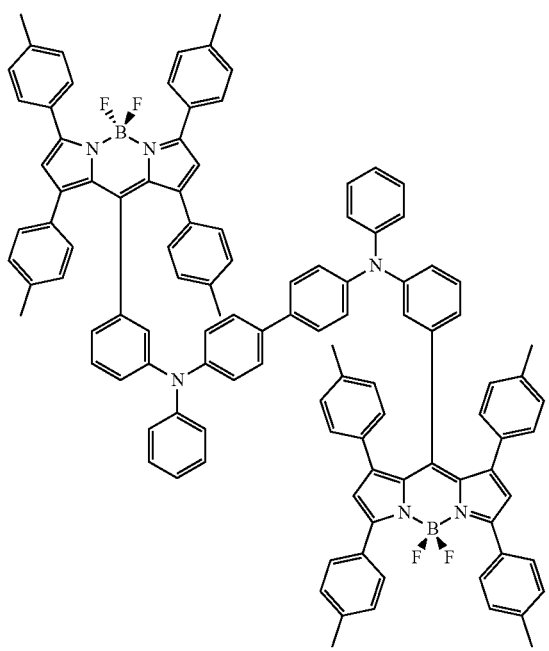
2-8
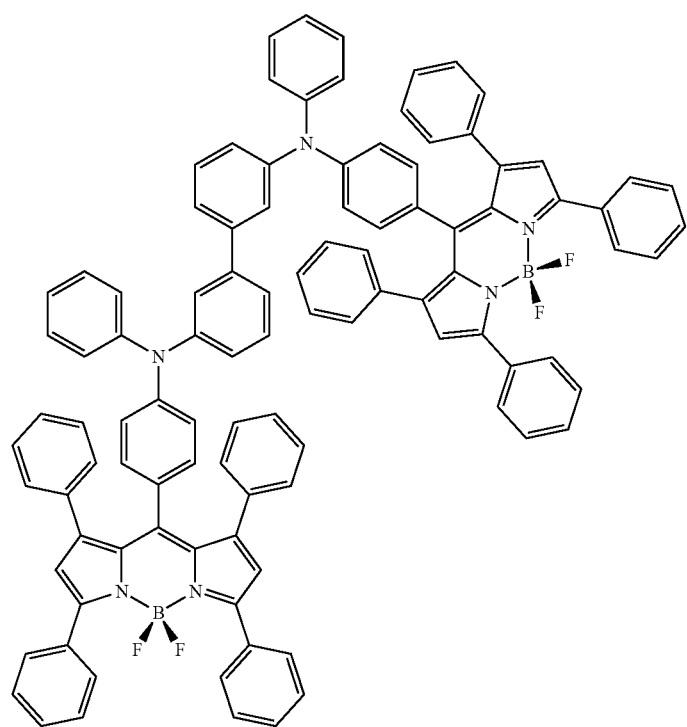

6. An organic light emitting diode, comprising:
a first electrode;
a second electrode facing the first electrode; and
an emitting material layer disposed between the first and second electrodes,
wherein the emitting material layer comprises an organic compound having the following structure of Chemical Formula 1:

[Chemical Formula 1]

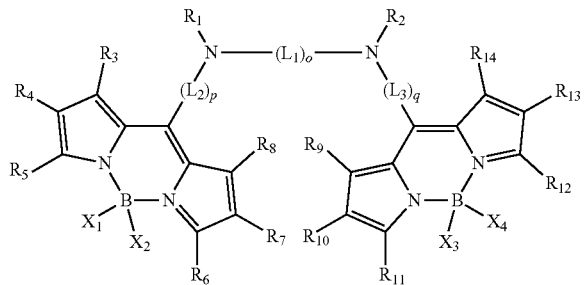

wherein each of $R_1$ and $R_2$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_{14}$ is independently selected from the group consisting of hydrogen, an unsubstituted or substituted $C_1$-$C_{20}$ alkyl group, an unsubstituted or substituted $C_1$-$C_{20}$ alkoxy group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or two adjacent groups among $R_3$ to $R_{14}$ form an unsubstituted or substituted $C_6$-$C_{20}$ aromatic ring or an unsubstituted or substituted $C_3$-$C_{20}$ hetero aromatic ring; each of $X_1$ to $X_4$ is independently halogen; each of $L_1$ to $L_3$ is independently an unsubstituted or substituted $C_6$-$C_{30}$ arylene group or an unsubstituted or substituted $C_3$-$C_{30}$ hetero arylene group; o is an integer of 1 or 2; and each of p and q is an integer between 0 (zero) to 2.

7. The organic light emitting diode of claim 6, wherein each of at least four groups among $R_3$ to $R_8$ and at least four groups among $R_9$ to $R_{14}$ is independently an unsubstituted or substituted $C_1$-$C_{10}$ alkyl group, each of $L_1$ to $L_3$ is independently an unsubstituted or substituted $C_6$-$C_{30}$ arylene group, and each of p and q is independently an integer of 1 or 2.

8. The organic light emitting diode of claim 6, wherein each of at least two groups among $R_3$, $R_5$, $R_7$ and $R_8$ and at least two groups among $R_9$, $R_{11}$, $R_{12}$ and $R_{14}$ is independently an unsubstituted or substituted $C_6$-$C_{20}$ aryl group or an unsubstituted or substituted $C_3$-$C_{20}$ hetero aryl group, each of $L_1$ to $L_3$ is independently an unsubstituted or substituted $C_6$-$C_{30}$ arylene group, and each of p and q is independently an integer of 1 or 2.

9. The organic light emitting diode of claim 6, wherein the emitting material layer comprises a first compound and a second compound, and wherein the second compound comprises the organic compound.

10. The organic light emitting diode of claim 9, wherein each of an excited singlet energy level and an excited triplet energy level of the first compound is higher than each of an excited singlet energy level and an excited triplet energy level of the second compound, respectively.

11. The organic light emitting diode of claim 9, the emitting material layer further comprises a third compound.

12. The organic light emitting diode of claim 11, wherein an excited singlet energy level of the second compound is higher than an excited singlet energy level of the third compound.

13. The organic light emitting diode of claim 6, wherein the emitting material layer comprises a first emitting material layer and a second emitting material layer, wherein the first emitting material layer is disposed between the first electrode and the second electrode and the second emitting material layer is disposed between the first electrode and the first emitting material layer or between the first emitting material layer and the second electrode.

14. The organic light emitting diode of claim 13, wherein the first emitting material layer comprises a first compound and a second compound, and the second emitting material layer comprises a fourth compound and a fifth compound, and wherein the second compound comprises the organic compound.

15. The organic light emitting diode of claim 14, wherein each of excited singlet energy levels and excited triplet energy levels of the first and fourth compounds is higher than each of an excited singlet energy level and an excited triplet energy level of the second compound, respectively.

16. The organic light emitting diode of claim 14, wherein an excited singlet energy level of the second compound is higher than an excited singlet energy level of the fifth compound.

17. The organic light emitting diode of claim 14, the emitting material layer further comprises a third emitting material layer disposed oppositely to the second emitting material layer with respect to the first emitting material layer, and wherein the third emitting material layer comprises a sixth compound and a seventh compound.

18. The organic light emitting diode of claim 17, wherein each of excited singlet energy levels and excited triplet energy levels of the first, fourth and sixth compounds is higher than each of an excited singlet energy level and an excited triplet energy level of the second compound, respectively.

19. The organic light emitting diode of claim 17, wherein an excited singlet energy level of the second compound is higher than each of excited singlet energy levels of the fifth and seventh compounds, respectively.

20. An organic light emitting device, comprising:
a substrate; and
an organic light emitting diode of claim 6 over the substrate.

21. The organic light emitting diode of claim 6, wherein the organic compound comprises any one having the following structure of Chemical Formula 2:

[Chemical Formula 2]
1-1
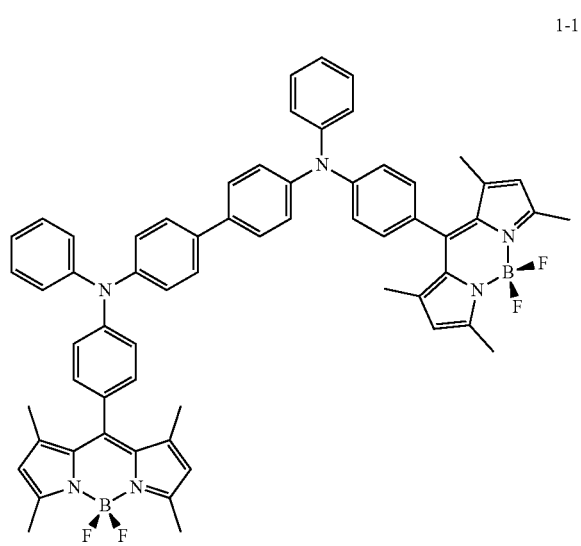
1-2
1-3
1-4
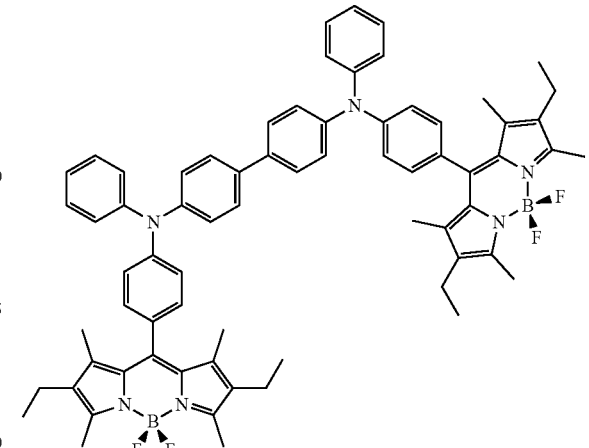
1-5
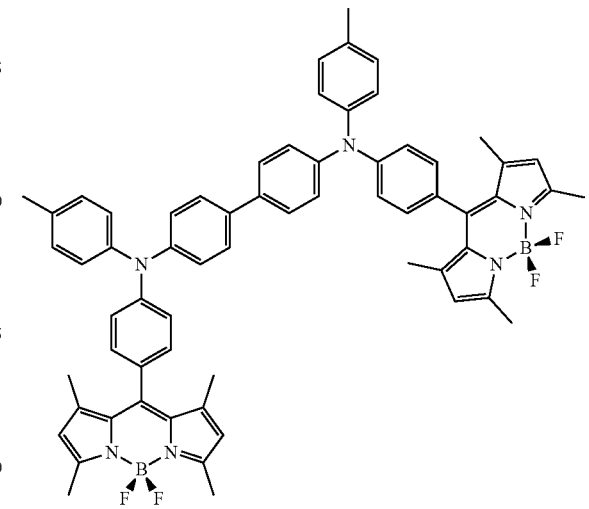
1-6
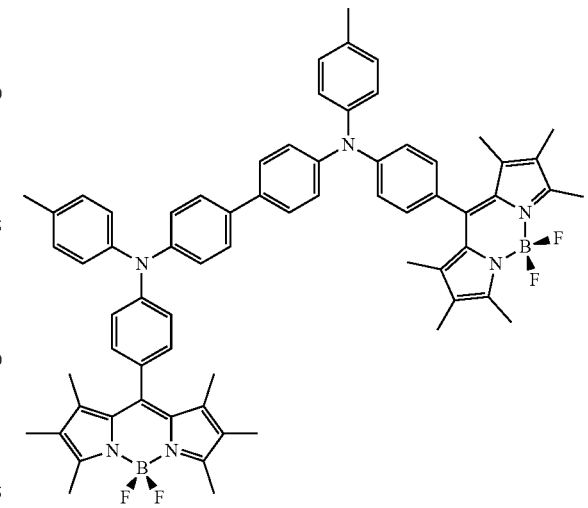

1-7
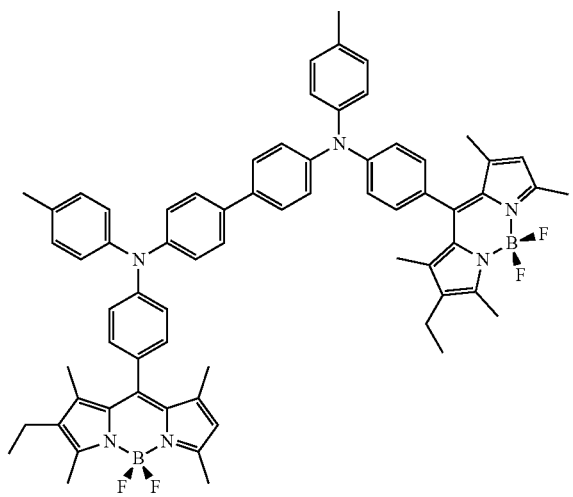
1-8
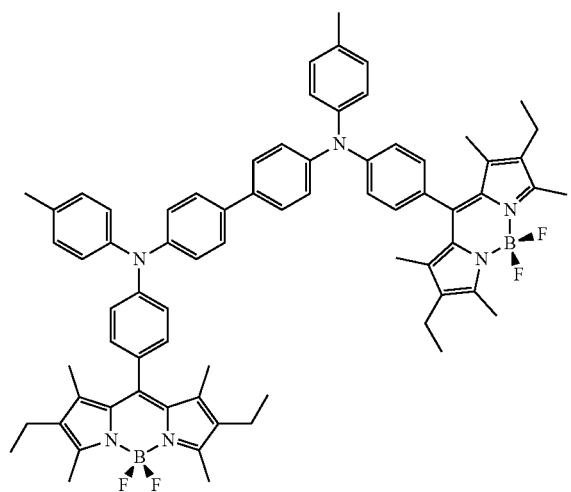
1-9
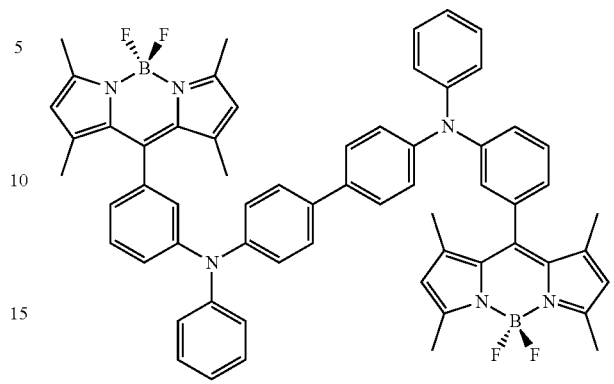
1-10
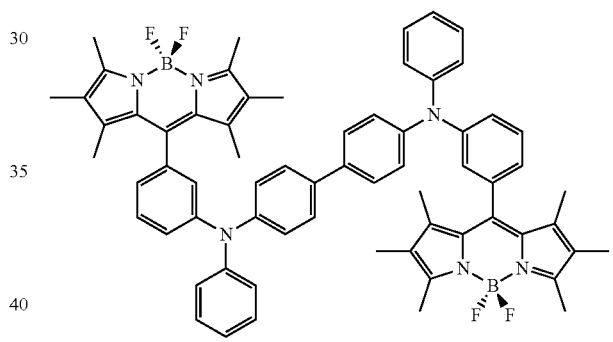
1-11
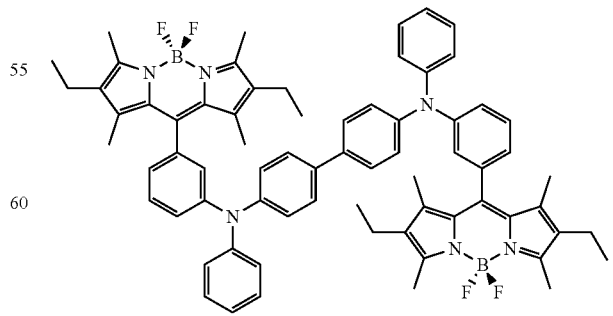

1-12
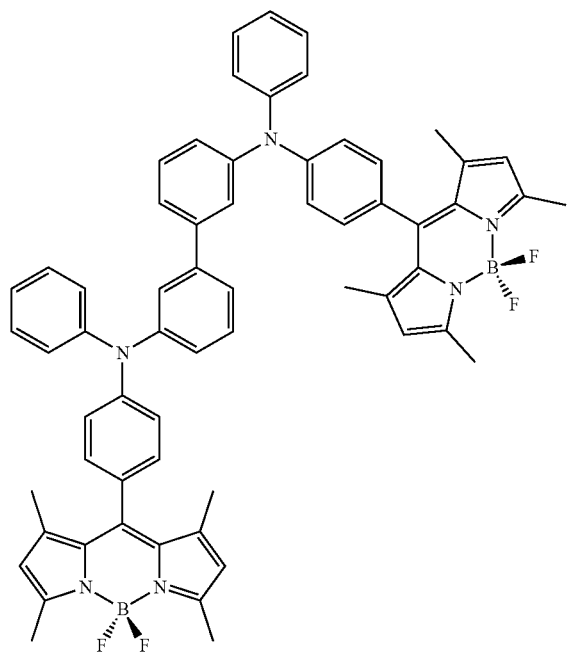
1-14
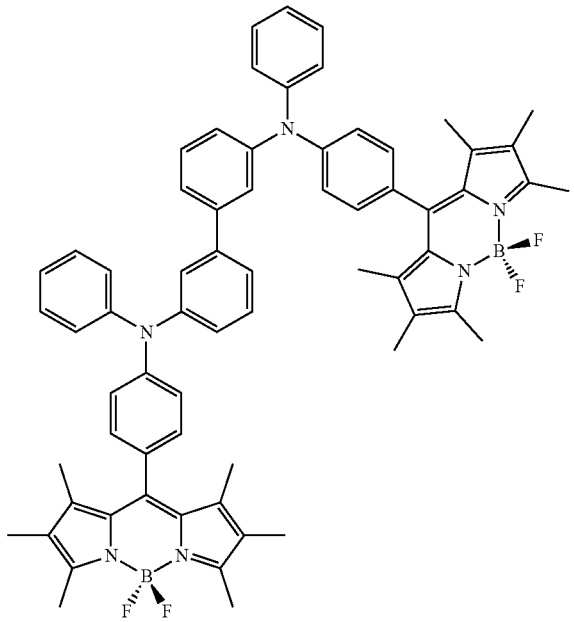
1-15
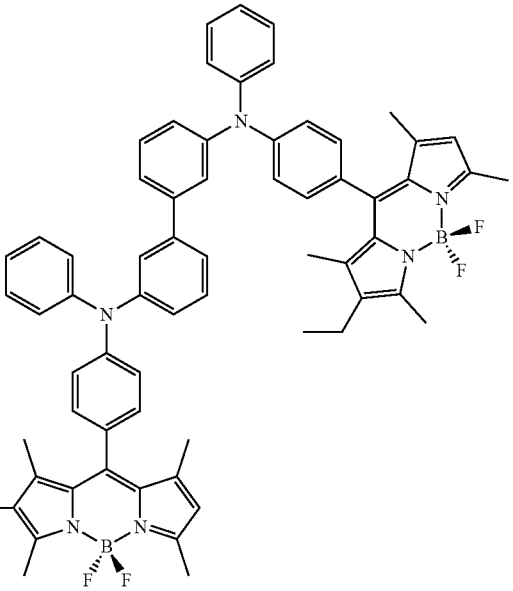
1-16
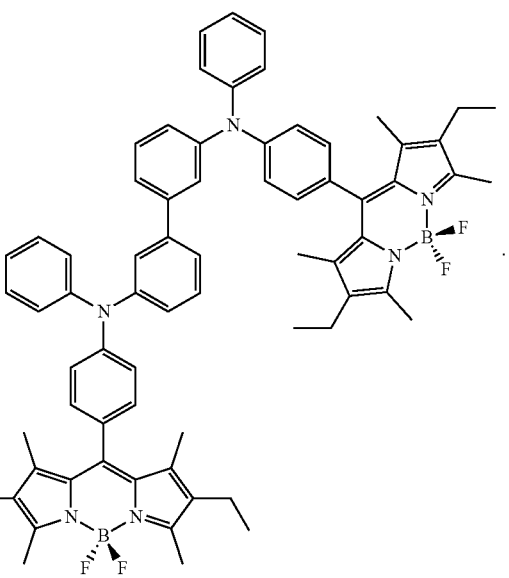
22. The organic light emitting diode of claim 6, wherein organic compound comprises any one having the following structure of Chemical Formula 3:

[Chemical Formula 3]
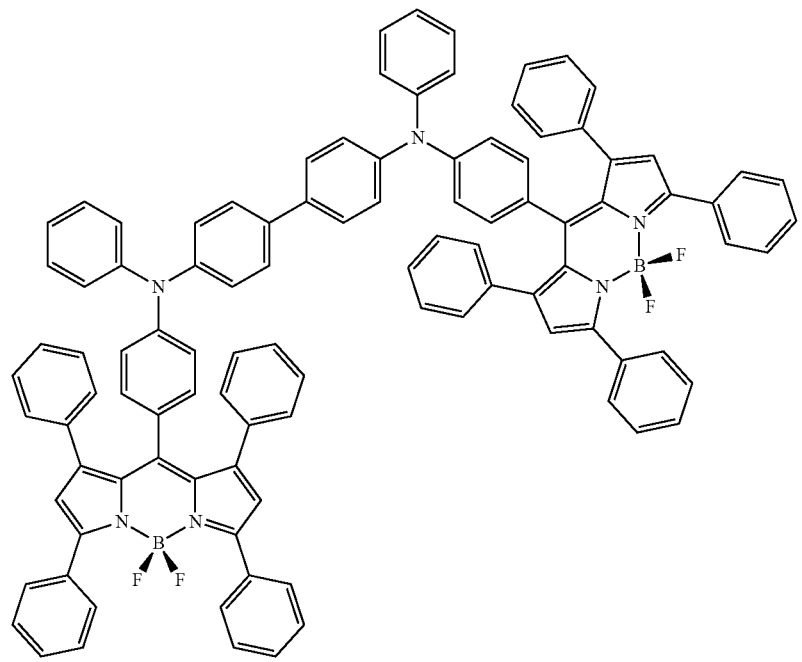
2-1
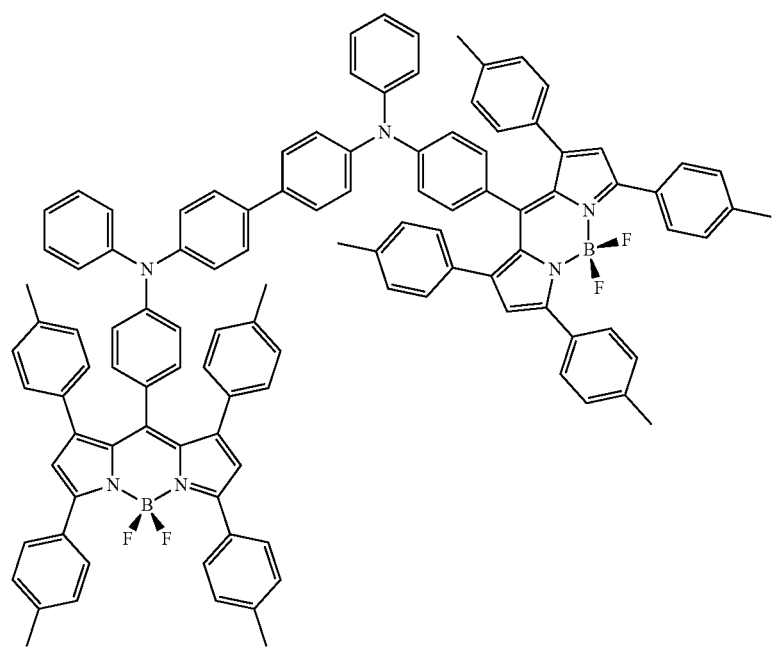
2-2

2-3
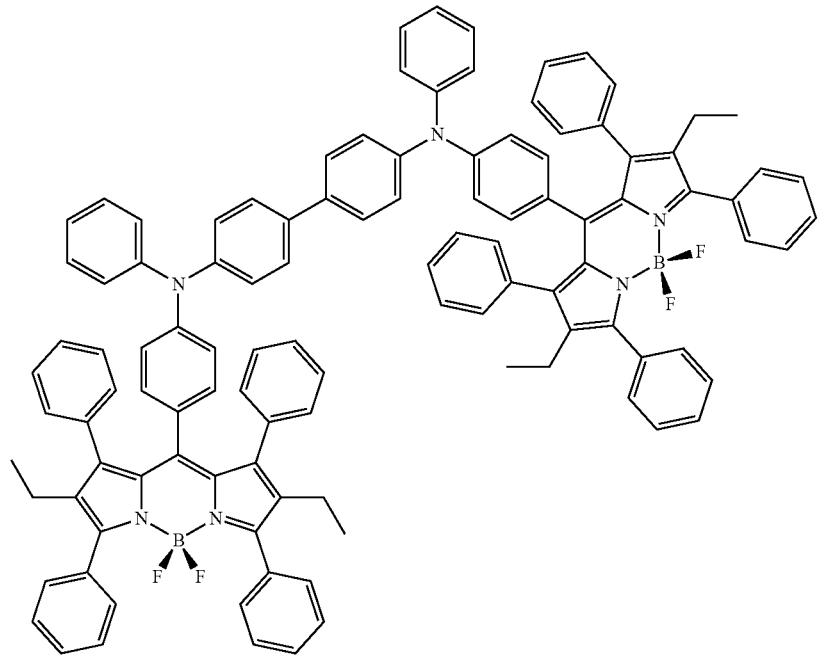
2-4
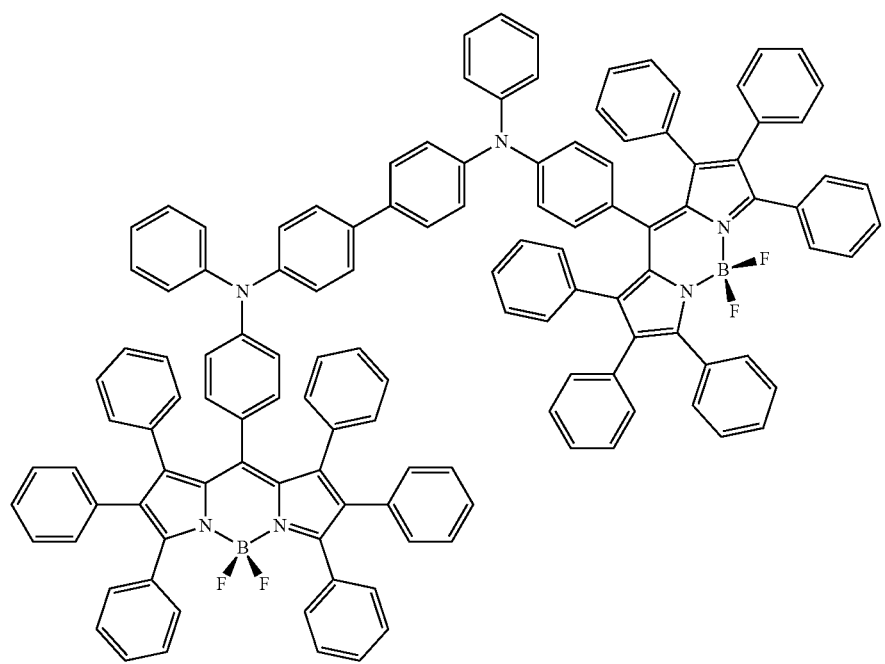

2-5
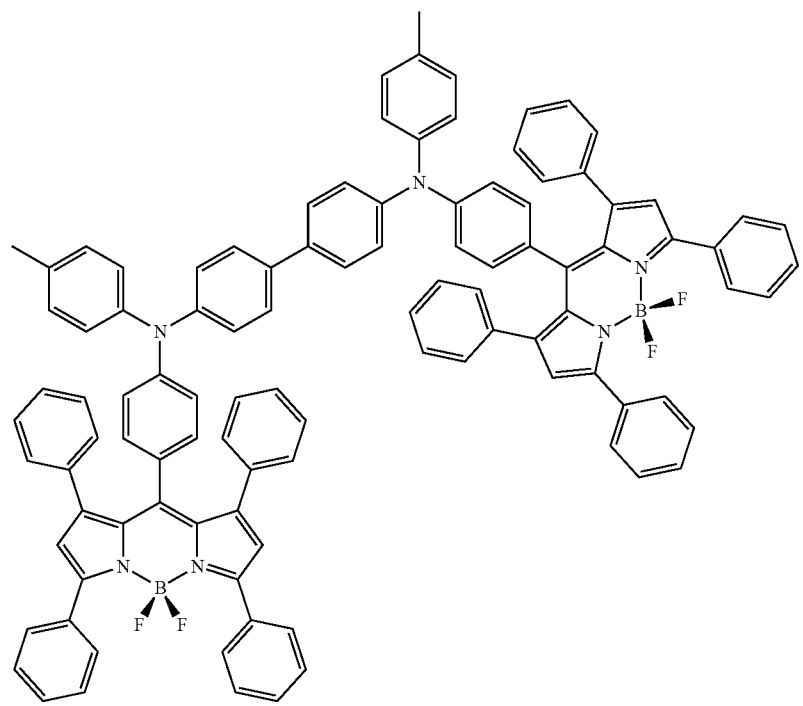
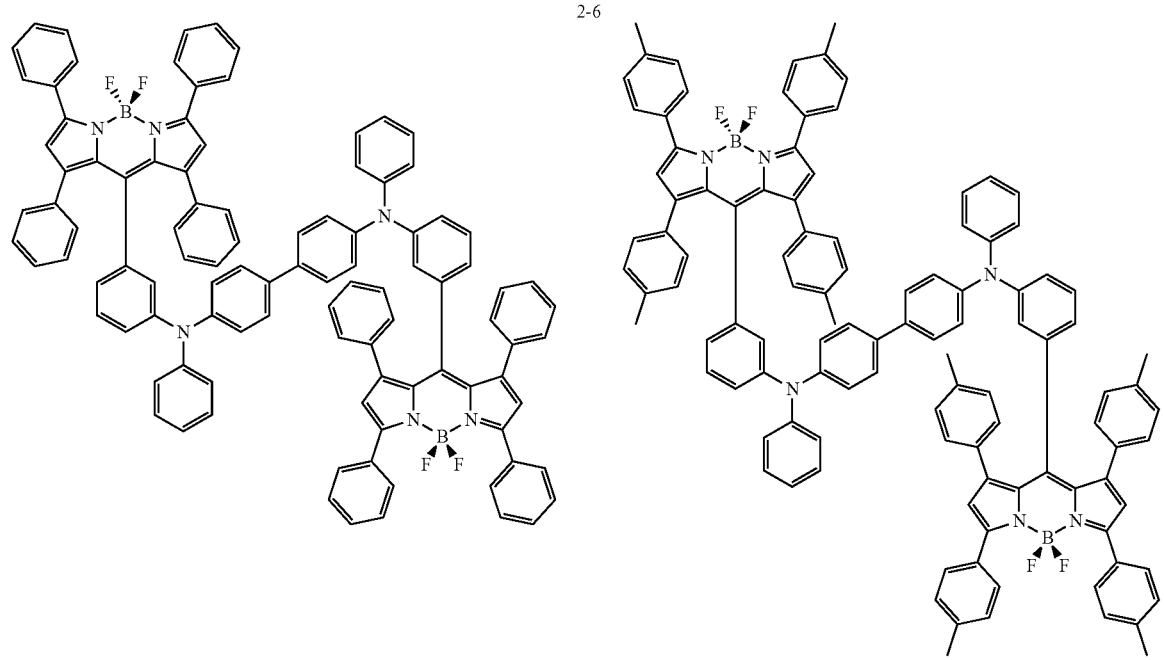

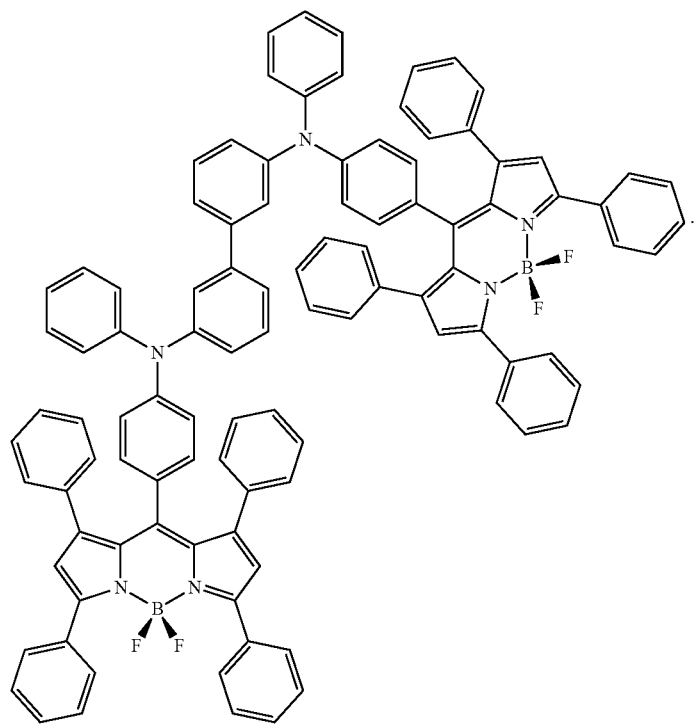
2-8
* * * * *